(12) United States Patent
Yeh et al.

(10) Patent No.: US 12,068,182 B2
(45) Date of Patent: Aug. 20, 2024

(54) DEVICE FOR RECOGNIZING WAFER IDENTIFICATION NUMBER WITH AUTOMATICALLY TURNING ON AND OFF RECOGNIZING FUNCTION

(71) Applicant: National Tsing Hua University, Hsinchu (TW)

(72) Inventors: Wei-Chang Yeh, Hsinchu (TW); Shi-Yi Tan, Hsinchu (TW); Yuan Tzu Lin, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 358 days.

(21) Appl. No.: 17/736,503

(22) Filed: May 4, 2022

(65) Prior Publication Data
US 2023/0260810 A1 Aug. 17, 2023

(30) Foreign Application Priority Data
Feb. 15, 2022 (TW) .................................. 111105417

(51) Int. Cl.
*H01L 21/67* (2006.01)
*G06V 30/14* (2022.01)
(Continued)

(52) U.S. Cl.
CPC .... *H01L 21/67294* (2013.01); *G06V 30/1431* (2022.01); *G06V 30/1437* (2022.01);
(Continued)

(58) Field of Classification Search
CPC ......... H01L 21/67294; H01L 21/67265; H01L 21/67303; H01L 21/681; H01L 21/6732; H01L 21/67313; H01L 21/67326; H01L 21/67333; H01L 21/6734; H01L 2223/54493; H01L 21/67242; G06V 30/1431; G06V 30/1437; G06V 2201/06
See application file for complete search history.

(56) References Cited

U.S. PATENT DOCUMENTS

| 5,030,057 A | * | 7/1991 | Nishi ................ H01L 21/67326 118/500 |
| 5,131,799 A | * | 7/1992 | Nishi ................ H01L 21/67781 414/940 |

(Continued)

FOREIGN PATENT DOCUMENTS

JP    H07211662    *    1/1994    ............. H01L 21/22

*Primary Examiner* — Michael P LaPage

(57) ABSTRACT

A device for recognizing wafer identification number with automatically turning on and off recognizing function comprises a base, a support frame, a light source, a plurality of image capturing units, an image recognition unit and a control unit. The base comprises a wafer boat placing portion and a first switch disposed on the wafer boat placing portion. The light source and the image capturing units are disposed on the support frame. The control unit is electrically connected to the first switch, the light source, the image capturing units and the image recognition unit. As such, the device for recognizing wafer identification number with automatically turning on and off recognizing function can automatically turn on and off the light source, the image capturing units, and the image recognition unit, therefore the operation is very easy and convenience.

10 Claims, 25 Drawing Sheets

(51) Int. Cl.
*H01L 21/673* (2006.01)
*H01L 21/68* (2006.01)

(52) U.S. Cl.
CPC .. *H01L 21/67265* (2013.01); *H01L 21/67303* (2013.01); *H01L 21/681* (2013.01); *G06V 2201/06* (2022.01)

(56) References Cited

U.S. PATENT DOCUMENTS

2008/0127467 A1* 6/2008 Hirano .............. H01L 21/67265
 29/25.01
2019/0057890 A1* 2/2019 Sato .................. H01L 21/67265

\* cited by examiner

DEVICE FOR RECOGNIZING WAFER IDENTIFICATION NUMBER WITH AUTOMATICALLY TURNING ON AND OFF RECOGNIZING FUNCTION

CROSS-REFERENCE TO RELATED APPLICATION

This application claims the priority of Taiwanese patent application No. 111105417, filed on Feb. 15, 2022, which is incorporated herewith by reference.

BACKGROUND OF THE INVENTION

1. Field of the Invention

The present invention relates generally to a wafer identification device, and more particularly, a device for wafer identification number with automatically turning on and off identification function.

2. The Prior Arts

In hybrid floor shop production, there is often a situation in which wafers provided by different suppliers are processed and produced at the same time. Optical character recognition (OCR) needs to be reconfigured and trained for different batches of wafers, which will greatly affect the production speed and make inspection a bottleneck on the production line. Therefore, wafer number identification has become an important part in semiconductor packaging and testing plants, which must quickly distinguish wafers to improve management efficiency and reduce the risk of wafer confusion or loss.

However, in the conventional wafer identification device, the light source, the image capturing unit and the image recognition unit are turned on and off by manually pressing a switch, which is troublesome in operation.

Furthermore, the conventional wafer identification device lacks a supplementary light source and only has a single image capture unit to capture images from a single angle, which is easily disturbed by the external environment, e.g., a changeable and light-disturbing environment so that the recognition effect is often poor.

In addition, the conventional wafer identification device needs to set and train the optical character identification in advance to obtain the font, which is difficult to cope with various production lines with mixed batches.

SUMMARY OF THE INVENTION

A primary objective of the present invention is to provide a device for recognizing wafer identification number with automatically turning on and off recognizing function, which can automatically turn on and off the light source, the image capture units and the image recognition unit, and is simple in operation.

Another objective of the present invention is to provide a device for recognizing wafer identification number with automatically turning on and off recognizing function, which can capture images from different angles by using a light source to supplement light and a plurality of image capturing units to capture images from different angles, and is not easily affected by the external environment interference and improves the recognition effect.

Another objective of the present invention is to provide a device for recognizing wafer identification number with automatically turning on and off recognizing function, which does not need to know the font type or obtain the font type in advance, and is easy to process mixed batches and diverse production lines.

In order to achieve the aforementioned objectives, the present invention provides a device for recognizing wafer identification number with automatically turning on and off recognizing function, comprising a base, comprising a wafer boat placing portion and at least one first switch disposed on the wafer boat placing portion; a support frame, at least one light source, disposed on the support frame; a plurality of image capturing units, disposed on the support frame; an image recognition unit, disposed on the support frame; and a control unit, electrically connected to the at least one first switch, the at least one light source, the image capturing units, and the image recognition unit; wherein, when a wafer boat is placed on the wafer boat placing portion, the at least one first switch transmits a first activation signal to the control unit, and the control unit activates the at least one light source, the image capturing units and the image recognition unit according to the first activation signal unit, the at least one light source projects light to a plurality of wafers in the wafer boat for supplementary light, the image capture units capture images of the identification numbers of the wafers in the wafer boat, the control unit receives the images of the identification numbers of the wafers and sends to the image recognition unit, and the image recognition unit recognizes the identification numbers of the wafers according to the images of the identification numbers of the wafers; wherein, after the wafer boat is removed from the wafer boat placing portion, the at least one first switch transmits a first turn-off signal to the control unit, and the control unit turns off the at least one light source, the image capture units and the image recognition unit according to the first turn-off signal.

In a preferred embodiment, the base further comprises a positioning member, the positioning member is disposed on the wafer boat placing portion and defines at least one positioning groove, and the at least one first switch is located in the at least one positioning groove; and wherein when the wafer boat is placed in the wafer boat placing portion, at least one protrusion of the wafer boat is positioned in the at least one positioning groove and presses the at least one first switch.

In a preferred embodiment, the support frame comprises a seat and a support member, the wafer boat placing portion is disposed on the seat, the support member is fixed on the seat, and the at least one light source and the image capture units are disposed on the support member.

In a preferred embodiment, the support frame comprises a seat and a support member, the wafer boat placing portion is disposed on the seat, the support member can be lifted and lowered relative to the seat, and the at least one light source and the image capture units are disposed on the support member; wherein when the wafer boat is placed in the wafer boat placing portion, the support member moves upward to a first position and is located above the seat; and wherein, after the wafer boat is removed from the wafer boat placing portion, the support member moves downward to a second position and below the seat.

In a preferred embodiment, the support frame further comprises a lifting mechanism, the lifting mechanism is disposed on the seat and is electrically connected to the control unit, and the support member is disposed on the lifting mechanism; wherein, when the wafer boat is placed on the wafer boat placing portion, the control unit controls the lifting mechanism according to the first activation signal, so that the lifting mechanism drives the support member to move upward to the first position; and wherein, after the wafer boat is removed from the wafer boat placing portion, the control unit controls the lifting mechanism according to the first turn-off signal, so that the lifting mechanism drives the support member to move downward to the second position.

In a preferred embodiment, the lifting mechanism comprises a rail, a slider and a driving unit, the rail is fixed to the seat, the slider is slidably disposed on the rail, the driving unit is connected to the slider and is electrically connected to the control unit, and the support member is disposed on the slider; wherein, when the wafer boat is placed on the wafer boat placing portion, the control unit controls the driving unit according to the first activation signal, and the driving unit drives the slider to move upward along the rail, so that the slider drives the support member to move upward to the first position; wherein, after the wafer boat is removed from the wafer boat placing portion, the control unit controls the driving unit according to the first turn-off signal, and the driving unit drives the slider to move downward along the rail, so that the slider drives the support member downward to the second position.

In a preferred embodiment, the support frame further comprises a first position sensor and a second position sensor, the first position sensor is disposed on the lifting mechanism and is electrically connected to the control unit, and the second position sensor is disposed on the lifting mechanism and is electrically connected to the control unit; wherein, when the first position sensor senses that the support member is at the first position, the first position sensor transmits a first sensing signal to the control unit, the control unit determines that the support member is located at the first position according to the first sensing signal and further activates the at least one light source, the image capturing units and the image recognition unit according to the first activation signal; and wherein, when the second position sensor senses that the support member is at the second position, the second position sensor sends a second sensing signal to the control unit, and the control unit determines that the support member is at the second position according to the second sensing signal and further turns off the at least one light source, the image capturing units and the image recognition units according to the first turn-off signal.

In a preferred embodiment, the base comprises a pivot portion, the pivot portion is disposed on the wafer boat placing portion, the support frame comprises a seat and a support member, and the support member is fixed on the seat and pivoted on the pivot portion, the at least one light source and the image capturing units are all disposed on the support member; wherein, when the wafer boat contacts the seat, the support member rotates upward relative to the pivot portion, so that the seat rotates downward to a first position, and the wafer boat is placed in the wafer boat placing portion; and wherein, after the wafer boat is removed from the wafer boat placing portion, the support member is rotated downward relative to the pivot portion, so that the seat is rotated upward to a second position.

In a preferred embodiment, when the wafer boat contacts the seat, the base is pressed down by the weight of the wafer boat and rotates downward, while the support member is pulled by the seat and rotates upward relative to the pivot portion; and wherein, after the wafer boat is removed from the wafer boat placing portion, the weight of the support member makes the support member rotate downward relative to the pivot portion, and the seat is pulled by the support member to rotate upward to the second position.

In a preferred embodiment, the support frame further comprises at least one second switch and a rotation mechanism, the at least one second switch is disposed on the base and is electrically connected to the control unit, and the rotation mechanism is connected to the support member and electrically connected to the control unit; wherein when the wafer boat contacts the seat, the at least one second switch transmits a second activation signal to the control unit, the control unit controls the rotation mechanism according to the second activation signal, the rotation mechanism drives the support member to rotate upward relative to the pivot portion, and the seat is pulled by the support member to rotate downward to the first position, and the wafer boat is placed in the wafer boat placing portion; and wherein, after the wafer boat is removed from the wafer boat placing portion, the at least one second switch transmits a second turn-off signal, the control unit controls the rotation mechanism according to the second turn-off signal, the rotation mechanism drives the support member to rotate downward relative to the pivot portion, and the seat is pulled by the support member to rotate upward to the second position.

The effect of the present invention is that the device for recognizing wafer identification number with automatically turning on and off recognizing function of the present invention can automatically turn on and off the light source, the image capturing units and the image recognition unit, and the operation is simple.

Furthermore, the device for recognizing wafer identification number with automatically turning on and off recognizing function of the present invention can use the light source to supplement light, and a plurality of image capturing units to capture images from different angles, and is not easily disturbed by the external environment, thereby improving the identification effect.

In addition, the device for recognizing wafer identification number with automatically turning on and off recognizing function of the present invention does not need to know or obtain fonts in advance, and is easy to cope with various production lines with mixed batches.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
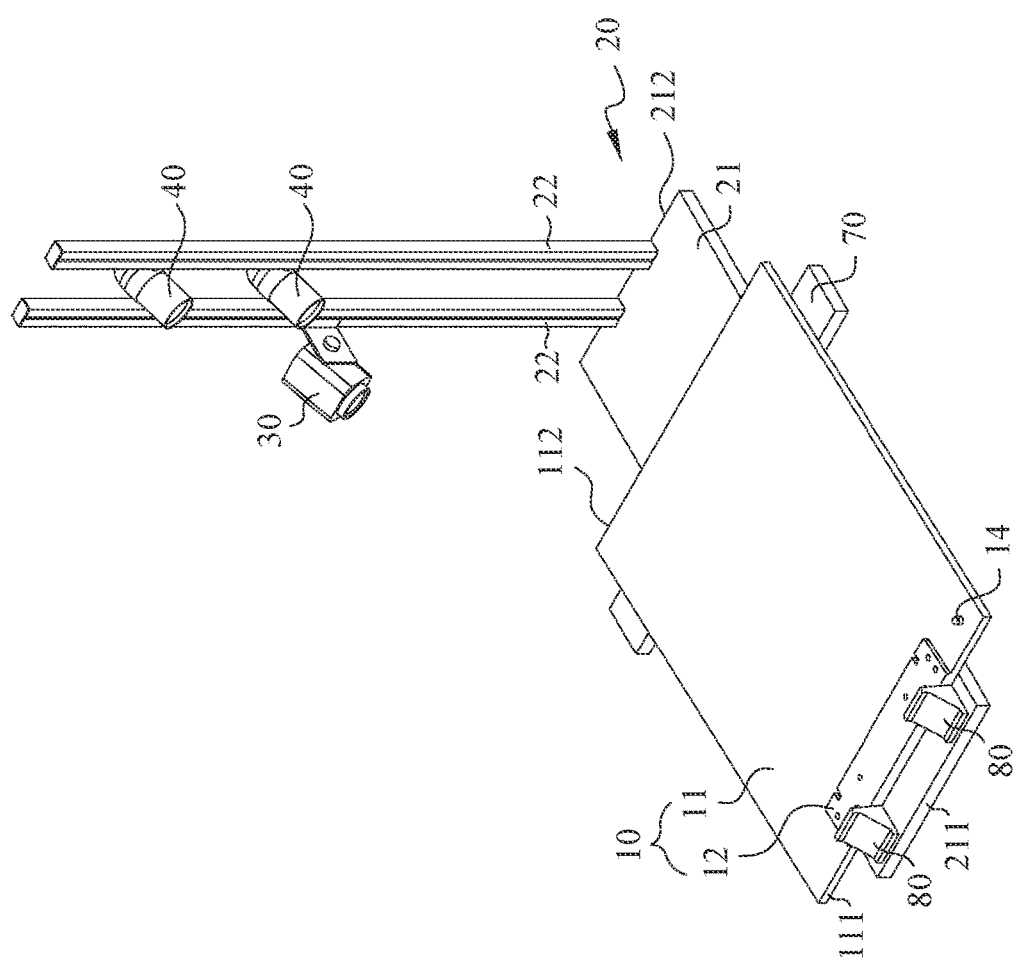
FIG. 1 is a schematic perspective view of a first embodiment of the present invention.
Figure 2:
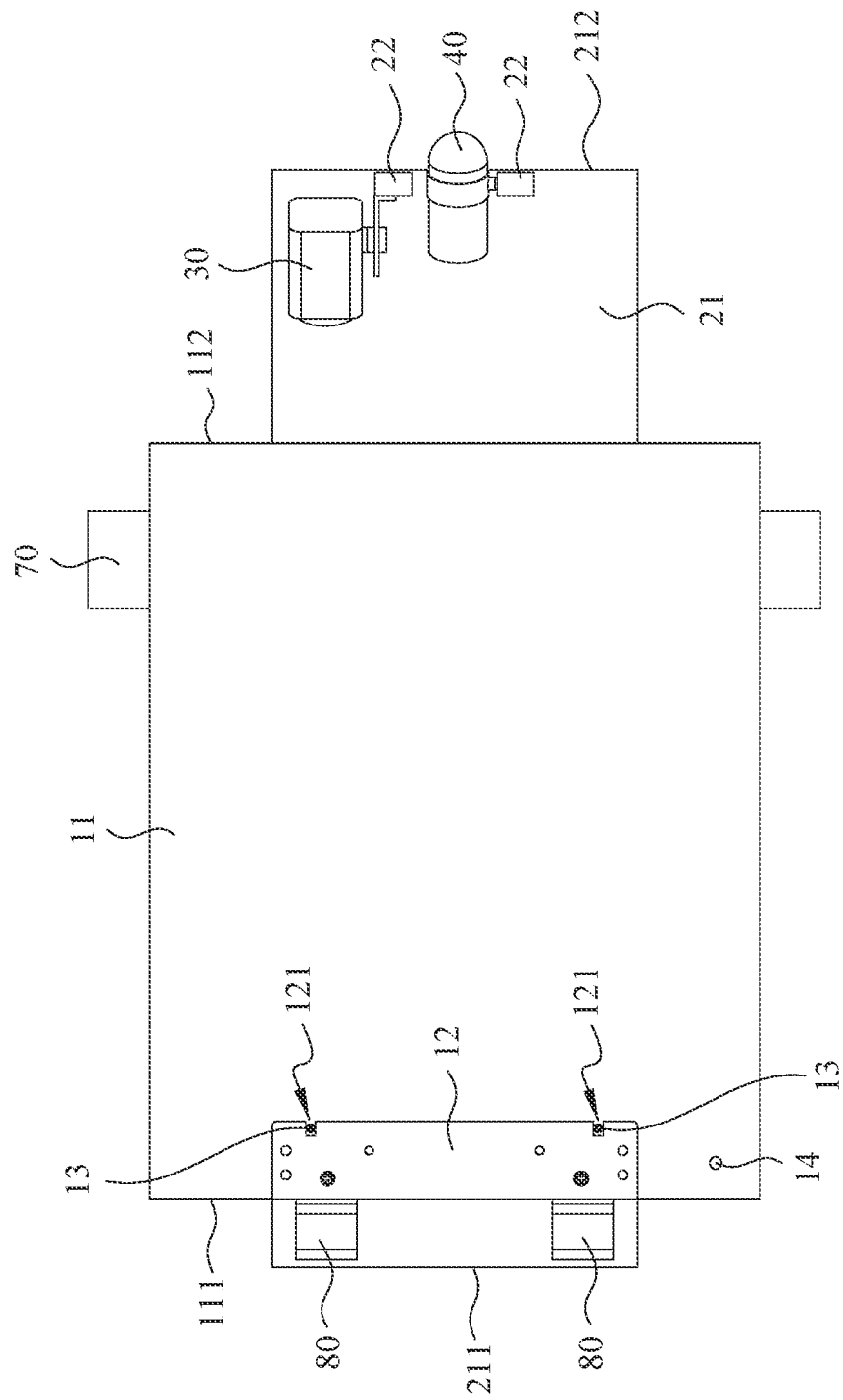
FIG. 2 is a top view of the first embodiment of the present invention.
Figure 3:
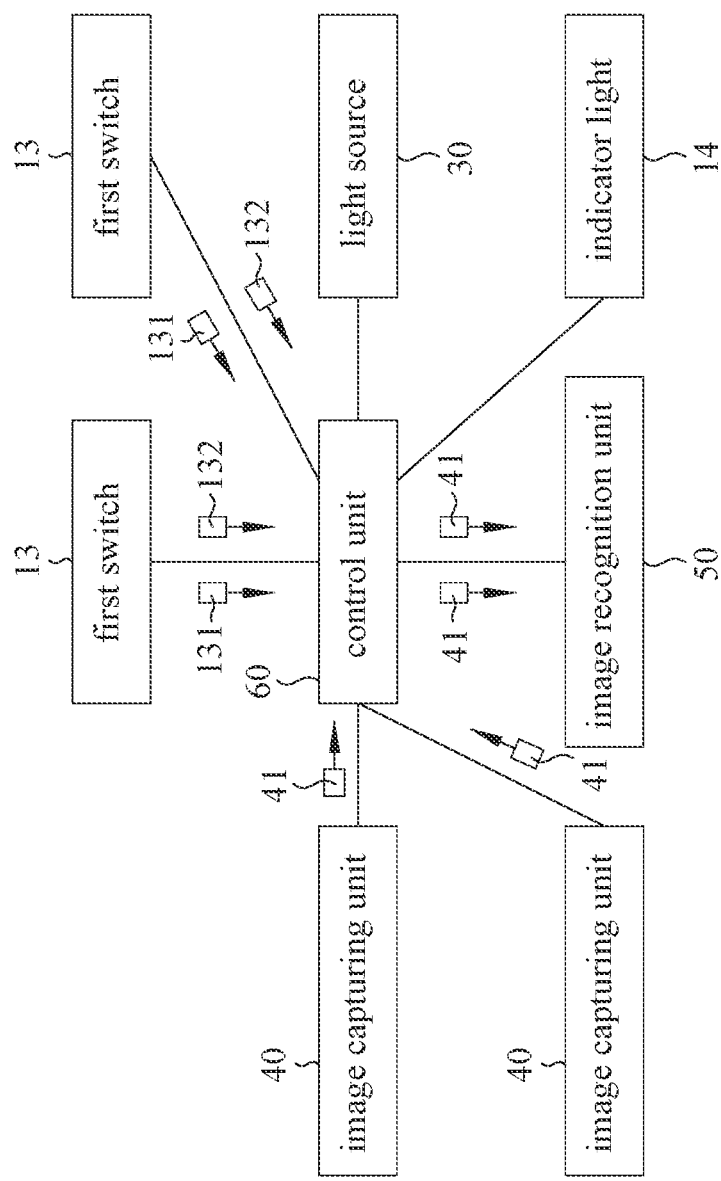
FIG. 3 is a block diagram showing the structure of the first embodiment of the present invention.

FIG. 1 to FIG. 3 are respectively a schematic perspective view, a top view and a structural block diagram of the first embodiment of the present invention. As shown in FIG. 1 to FIG. 3, the present invention provides a device for recognizing wafer identification number with automatically turning on and off recognizing function, including a base 10, a support frame 20, a light source 30, a plurality of image capturing units 40, an image identification unit 50, and a control unit 60. The base 10 includes a wafer boat placing portion 11, a positioning member 12 and two first switches 13. The positioning member 12 is disposed on a first end 111 of the wafer boat placing portion 11 and defines two positioning grooves 121. The first switches 13 are disposed on the wafer boat placing portion 11 and are respectively located in the positioning grooves 121. The support frame 20 includes a seat 21 and two support members 22. The wafer boat placing portion 11 is disposed on the seat 21. The support members 22 are fixed on the seat 21 and are close to a second end 212 of the seat 21. The light source 30 is disposed on one of the support members 22. The image capturing units 40 are disposed on the other support member 22. The control unit 60 is electrically connected to the first switches 13, the light source 30, the image capturing units 40 and the image recognition unit 50.

Figure 4A:
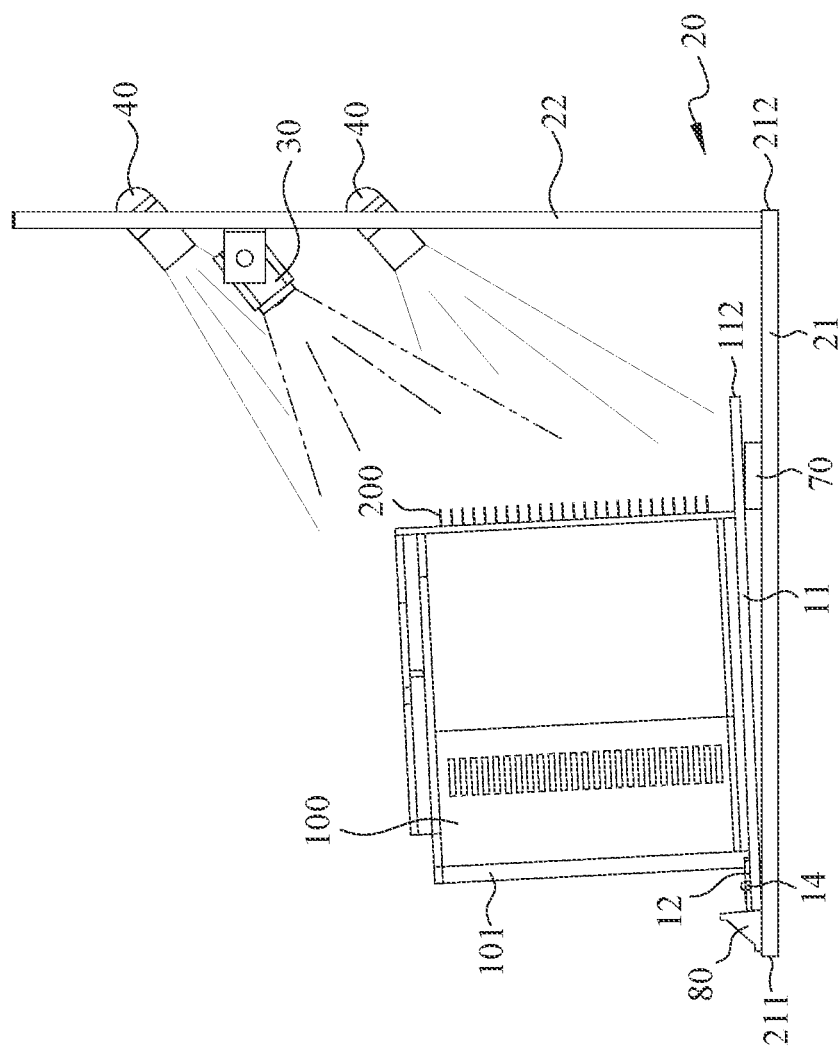
FIG. 4A is a schematic view of recognizing identification number performed according to the first embodiment of the present invention.
Figure 4B:
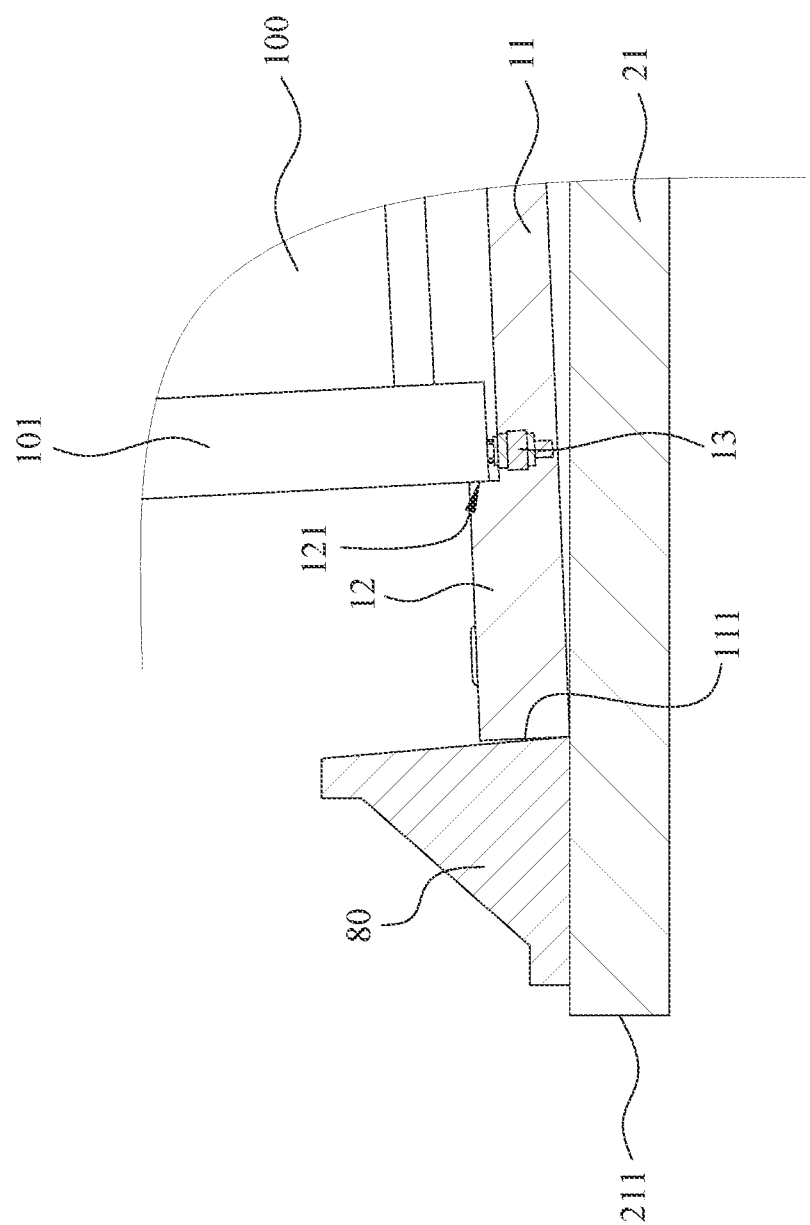
FIG. 4B shows a schematic view of the protrusion of the wafer boat pressing the first switch.
Figure 5A:
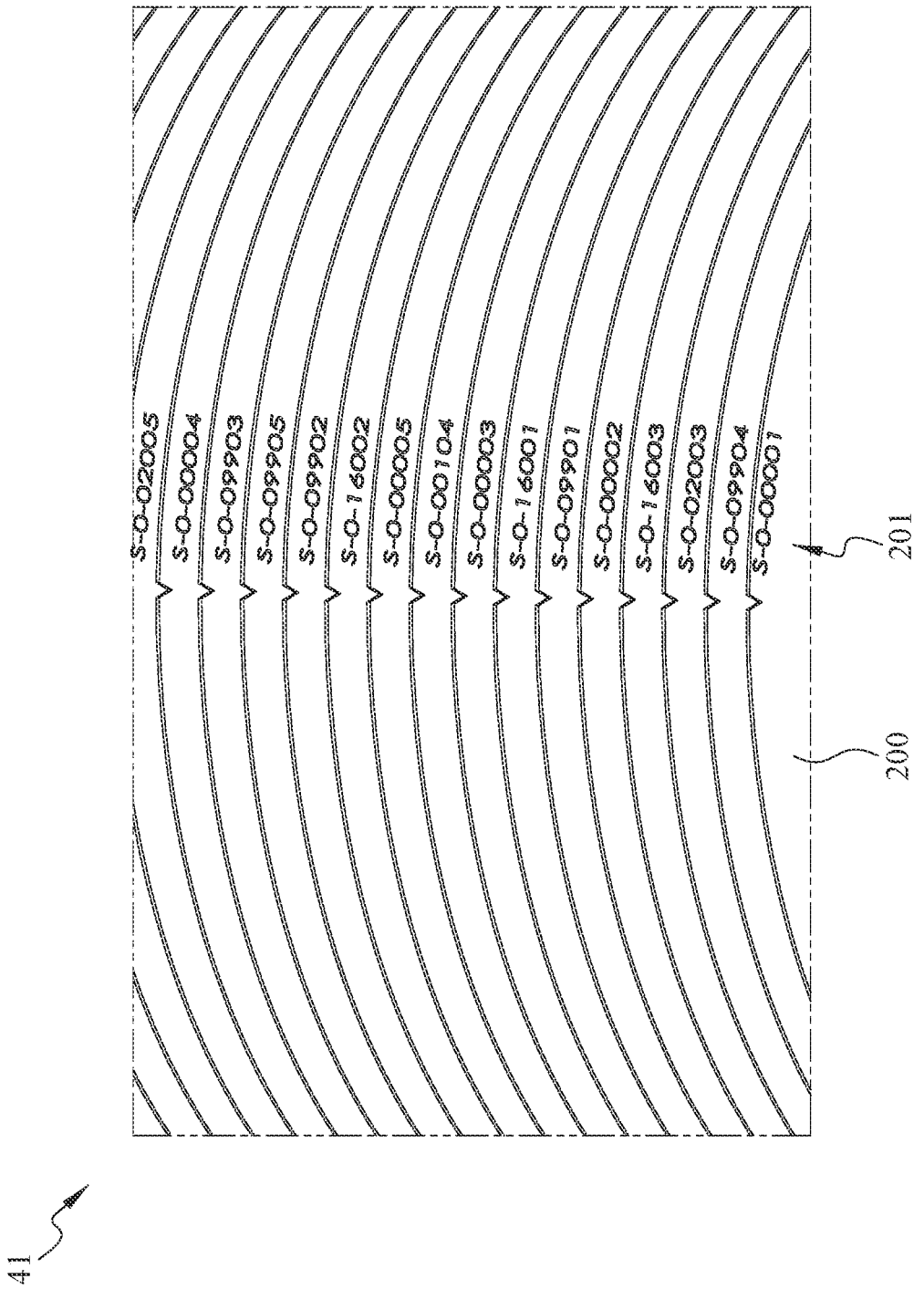
FIG. 5A shows a schematic view of an image of the identification number of the wafer.
Figure 5B:
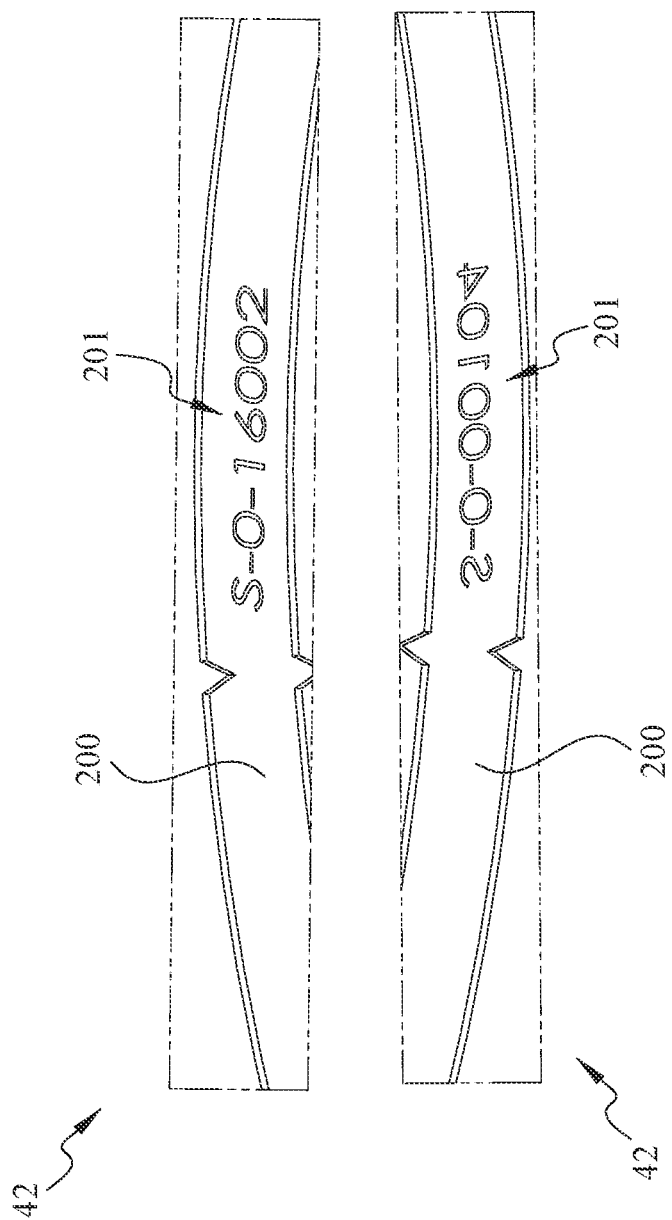
FIG. 5B shows a schematic view of the image after character slicing.
Figure 5C:
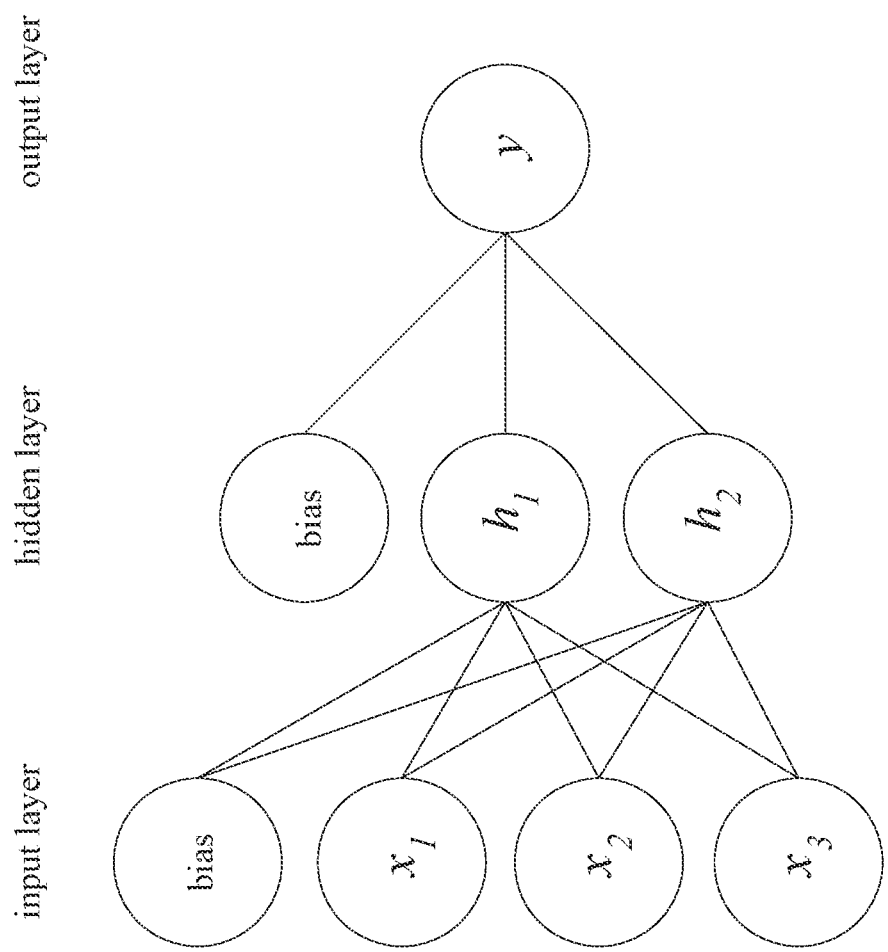
FIG. 5C shows a schematic view of the image recognition unit optimizing the image weight for the identification number of the wafer.

FIG. 4A is a schematic view of the device for recognizing wafer identification number 201 according to the first embodiment of the present invention, FIG. 4B shows a schematic view of the protrusion 101 of the wafer boat 100 pressing the first switch 13, FIG. 5A shows the identification number of the wafer 200, FIG. 5B shows a schematic view of the image 42 of the identification number 201 of the diced wafer 200 after dicing, and FIG. 5C shows the image 42 of the identification number 201 of the diced wafer 200 after weight optimization. The operation mode and effect of the first embodiment will be described below with reference to the drawings.

As shown in FIG. 4A and FIG. 4B, when a wafer boat 100 is placed on the wafer boat placing portion 11, the two protrusions 101 of the wafer boat 100 are respectively positioned in the positioning grooves 121 and press the first switch 13, and the opening of the wafer boat 100 faces the support members 22 sideways; in other words, the wafer boat 100 is placed horizontally on the wafer boat placing portion 11, and the tops of the plurality of wafers 200 in the wafer boat 100 face the support member 22. As shown in FIG. 3, the first switches 13 synchronously transmit a first activation signal 131 to the control unit 60, and the control unit 60 activates the light source 30, the image capturing units 40, and the image recognition unit 50 according to the first activation signals 131. As shown in FIG. 4A, the light source 30 laterally projects light to the wafers 200 in the wafer boat 100 for supplementary light, and the image capturing units 40 laterally capture the images 41 of identification number 201 (shown in FIG. 5A) of the wafers 200 in the wafer boat 100. As shown in FIG. 3 and FIGS. 5A to 5C, the control unit 60 receives the images 41 of the identification numbers 201 of the wafers 200 and transmits the images 41 to the image recognition unit 50, and the image recognition unit 50 determines the identification numbers 201 of the wafers 200 according to the images 41 of identification number 201 of the wafers 200. More specifically, the image recognition unit 50 uses a Simplified Swarm Optimization (SSO) to perform character slicing on the images 41 of the identification numbers 201 of the wafers 200, and the sliced image 42 after character slicing is shown in FIG. 5B. The image recognition unit 50 uses a convolutional neural network (CNN) to further optimize the weight of the sliced image 42 after the character slicing. As shown in FIG. 5C, more clearly, the CNN includes an input layer, a hidden layer, and an output layer, and the hidden layer includes a convolutional layer, a rectification layer, and a pooling layer, a fully connected layer, each layer contains multiple neurons, and the neurons are connected by weights. The neural network structure and weights constitute the main body of the model. By SSO, the neural architecture search optimization is realized, the best neural network architecture is found, and the hyperparameters of the network structure are adjusted.

In summary, the main body of the identification model obtained by deep learning is the network architecture and the weights between neurons. In addition to the optimization of the network structure, the SSO also realizes the optimization of the weights. Through optimizing the network structure and weight by SSO, the network structure and the number of weights are reduced, and the recognition efficiency of the model is improved. Therefore, the recognition efficiency of the image recognition unit 50 is improved to complete the entire recognition process in just 1 minute and 30 seconds, and the recognition accuracy is improved to 99.5%, which is higher than 92% in the industry.

As shown in FIG. 1 and FIG. 3, after the wafer boat 100 is removed from the wafer boat placing portion 11, the first switches 13 synchronously transmit a first turn-off signal 132 to the control unit 60, and the control unit 60 responds to the first turn-off signal 132 to turn off the light source 30, the image capturing units 40, and the image recognition unit 50.

As shown in FIG. 1 to FIG. 3, in the first embodiment, the base 10 further includes an indicator light 14. The indicator light 14 is disposed on the wafer boat placing portion 11 and is electrically connected to the control unit 60. If only one of the protrusions 101 of the wafer boat 100 presses one of the first switches 13, and the other protrusion 101 does not press the other first switch 13, the control unit 60 will only receive one first activation signal 131 and according to the activation signal 131 activates the indicator light 14, while the control unit 60 does not activate the light source 30, the image capturing units 40, and the image recognition unit 50. The user can judge from the indicator light 14 that the position of the wafer boat 100 is incorrect, and the wafer boat 100 must be repositioned. If the two protrusions 101 of the wafer boat 100 press the two first switches 13 respectively, the control unit 60 will receive two first activation signals 131 and activate the light source 30, the image capturing units 40, and the image recognition unit 50 according to the first activation signals 131, and turn off the indicator light 14 at the same time. The user can judge that the position of the wafer boat 100 is correct from the fact that the indicator light 14 is off. After the wafer boat 100 is removed from the wafer boat placing portion 11, the first switches 13 synchronously transmit a first turn-off signal 132 to the control unit 60, and the control unit 60 activates the indicator light 14 according to the first turn-off signal 132 and makes the indicator light 14 change color to remind the user that the recognition operation has ended.

As shown in FIG. 1 and FIG. 2, the device for recognizing wafer identification number further includes a spacer 70. The spacer 70 is disposed between the seat 21 and the wafer boat placing portion 11, and is close to a second end 112 of the wafer boat placing portion 11, so that the wafer boat placing portion 11 can be tilted upward relative to the seat 21. As shown in FIG. 4A, when the wafer boat 100 is placed on the wafer boat placing portion 11, the elevation angle of the wafer boat placing portion 11 enables the light from the light source 30 to more easily shine on the surfaces of the wafers 200, and the image capturing unit 40 can capture the identification numbers of the wafers 200 more easily.

As shown in FIG. 1 and FIG. 2, in the first embodiment, the device for recognizing wafer identification number further includes two stoppers 80, which are disposed on the first end 211 of the seat 21 and abut against at the first end 111 of the wafer boat placing portion 11. As shown in FIG. 4, the stoppers 80 can prevent the wafer boat placing portion 11 from moving in the direction of the first end 211 of the seat 21. In this way, the wafer boat placing portion 11 can be kept at a fixed distance from the light source 30 and the image capturing units 40, so that the light of the light source 30 can be maintained at an optimal projection angle and distance to provide the image capturing units 40 an optimal shooting angle and distance to obtain clear images 41 of the identification numbers 201 of the wafers 200.

As shown in FIG. 4B, in the first embodiment, each first switch 13 is a pressure switch. In some embodiments, each first switch 13 may also be a micro switch or a sensor switch.

It is worth noting that, as shown in FIG. 4A, when the wafer boat 100 is placed horizontally, the wafers 200 in the wafer boat 100 are also placed horizontally. Since the 6-inch or 8-inch wafers 200 are lighter in weight, the 6-inch or 8-inch wafers 200 are less likely to be crushed by the weight when placed horizontally. However, the weight of the wafers 200 larger than 8 inches is heavier, so that the wafers 200 larger than 8 inches are more likely to be crushed by the influence of weight when placed horizontally. Therefore, the first embodiment is applicable to the 6-in and 6-in wafer 200, but not applicable to the wafer 200 of more than 8 inches.

As shown in FIG. 1 and FIG. 2, the light source 30 of the first embodiment is a light bulb, that is, the light source 30 of the first embodiment is a point light source.

In some embodiments, the number of the light sources 30 may be plural, and the light sources 30 can provide multi-angle supplementary light to improve the recognition effect.

Figure 6:
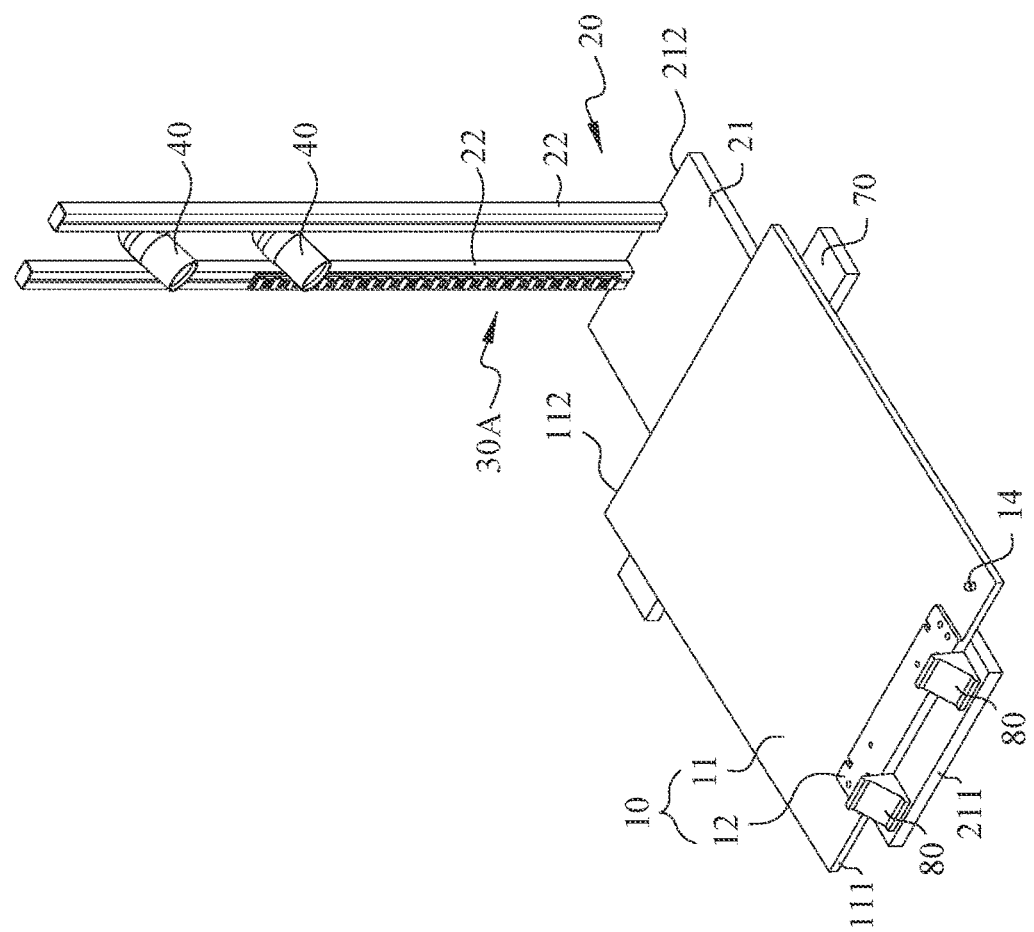
FIG. 6 is a schematic perspective view of a second embodiment of the present invention.

FIG. 6 is a schematic perspective view of a second embodiment of the present invention. As shown in FIG. 6, the difference between the second embodiment and the first embodiment is that the light source 30A of the second embodiment is a light bar, and the light bar includes a plurality of light emitting diodes.

Figure 7:
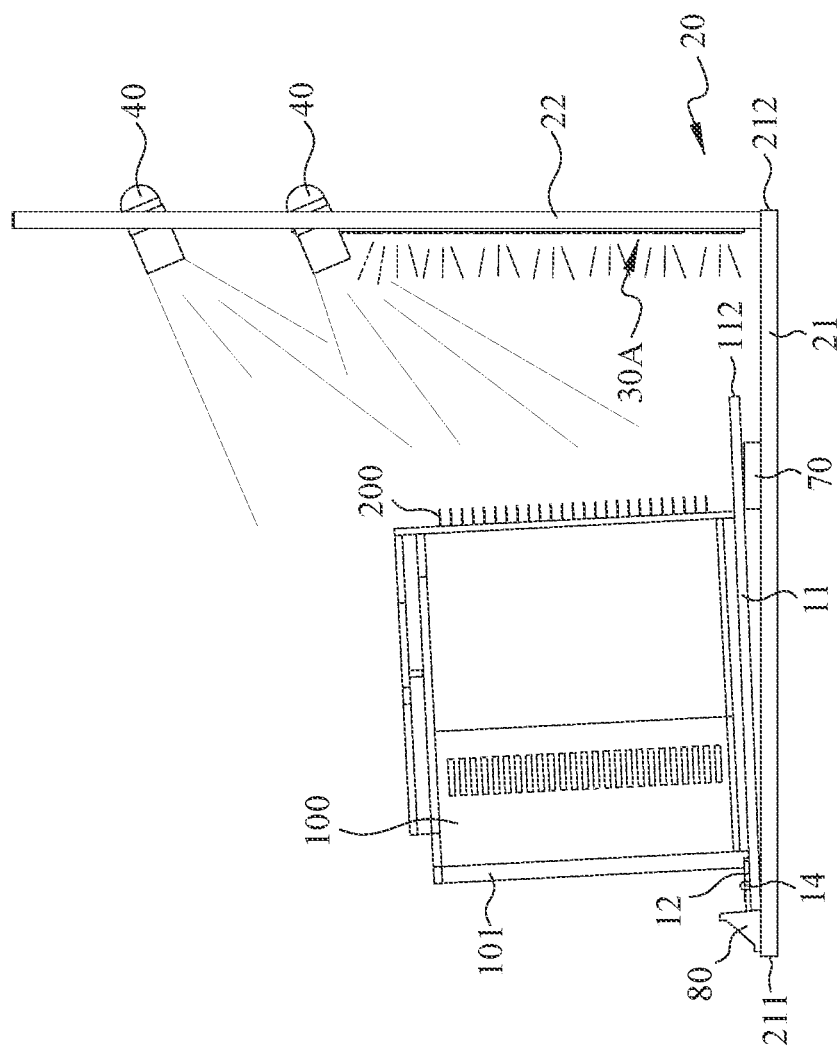
FIG. 7 is a schematic view of recognizing identification number performed by the second embodiment of the present invention.

FIG. 7 is a schematic view of the second embodiment of the present invention for recognizing identification number. As shown in FIG. 7, because the luminous flux of each light-emitting diode of the light bar is the same, the light provided by the light bar is scattered more uniformly than the point light source. Therefore, the light from the light bar can help the image capturing units 40 to capture clearer images 41 of the identification numbers 201 of the wafers 200, thereby enhancing the recognition effect of the image recognition unit 50 to recognize the identification numbers 201 of the wafers 200.

Figure 8:
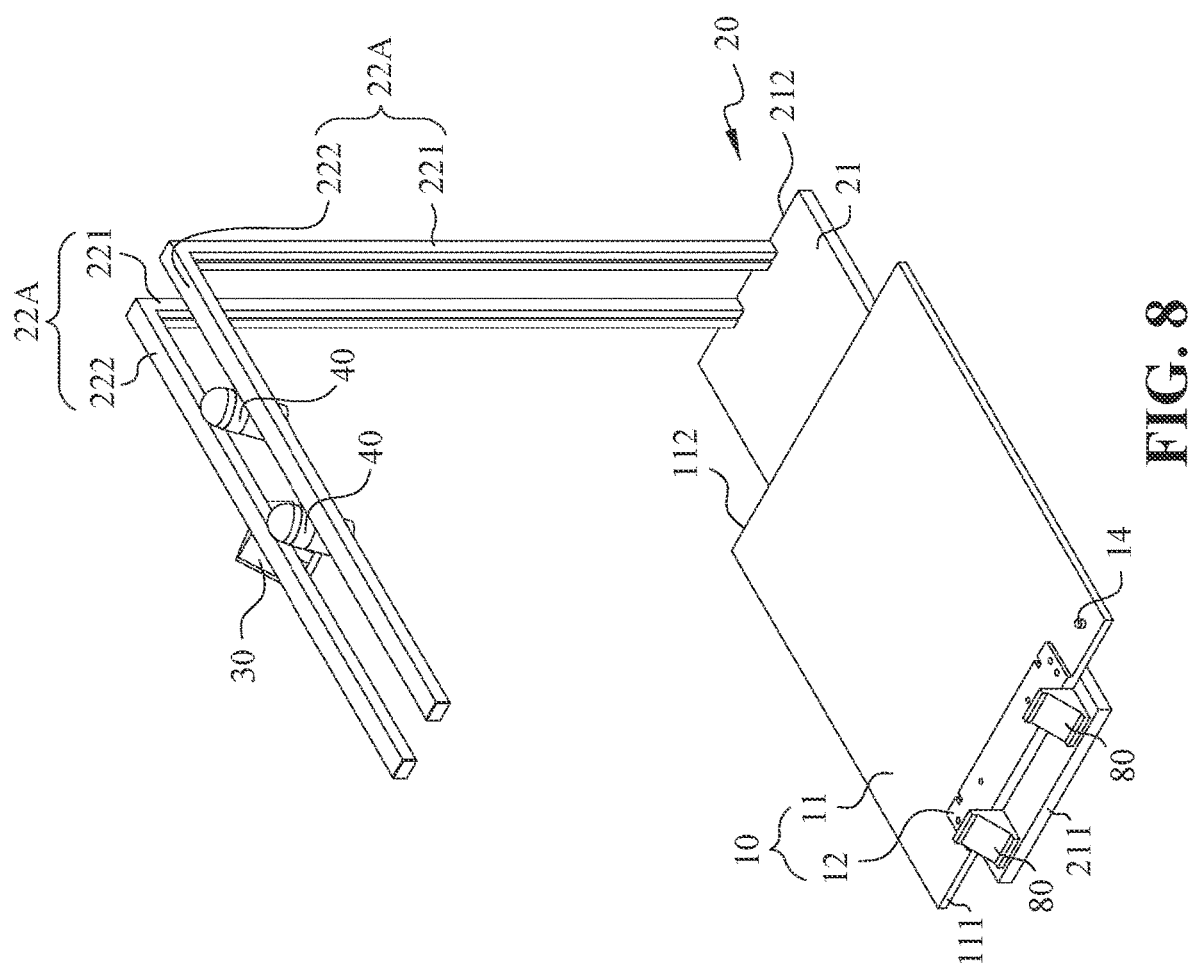
FIG. 8 is a schematic perspective view of a third embodiment of the present invention.

FIG. 8 is a schematic perspective view of a third embodiment of the present invention. As shown in FIG. 8, the difference between the third embodiment and the first embodiment is that: first, each support member 22A includes two vertical rods 221 and two horizontal rods 222, and the vertical rods 221 are fixed on the seat 21 and close to the second end 212 of the seat 21, the horizontal rods 222 extend laterally from the top ends of the vertical rods 221 and are located above the wafer boat placing portion 11, and the light source 30 and the image capturing units 40 are respectively arranged on the horizontal rods 222; and the spacer 70 is omitted.

Figure 9:
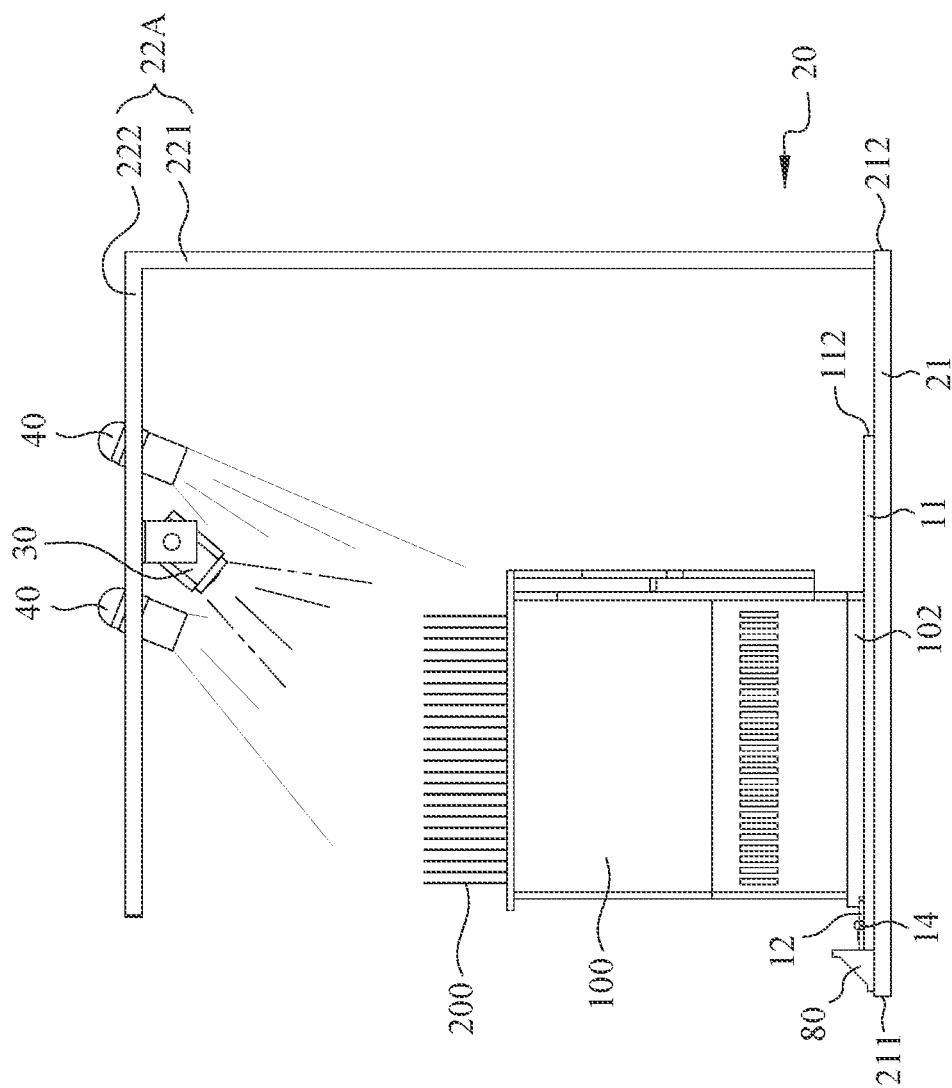
FIG. 9 is a schematic view of recognizing identification number performed by the third embodiment of the present invention.

FIG. 9 is a schematic view of a third embodiment of the present invention performing recognizing identification number. As shown in FIG. 9, when the wafer boat 100 is placed on the wafer boat placing portion 11, the two protrusions 102 of the wafer boat 100 are respectively positioned in the positioning grooves 121 and press the first switches 13. The openings face upwardly to the horizontal bars 222. In other words, the wafer boat 100 is vertically placed on the wafer boat placing portion 11; the light source 30 projects light to the wafers 200 in the wafer boat 100 from top to bottom for supplementary light, and the image capturing units 40 capture the images 41 of the identification numbers 201 of the wafers 200 in the wafer boat 100 from top to bottom.

It is worth noting that, as shown in FIG. 9, when the wafer boat 100 is placed vertically, the wafers 200 in the wafer boat 100 are also placed vertically. The third embodiment is applicable to wafers 200 of all sizes because the wafers are not affected by weight and are not crushed to each other when vertically placed.

Figure 10:
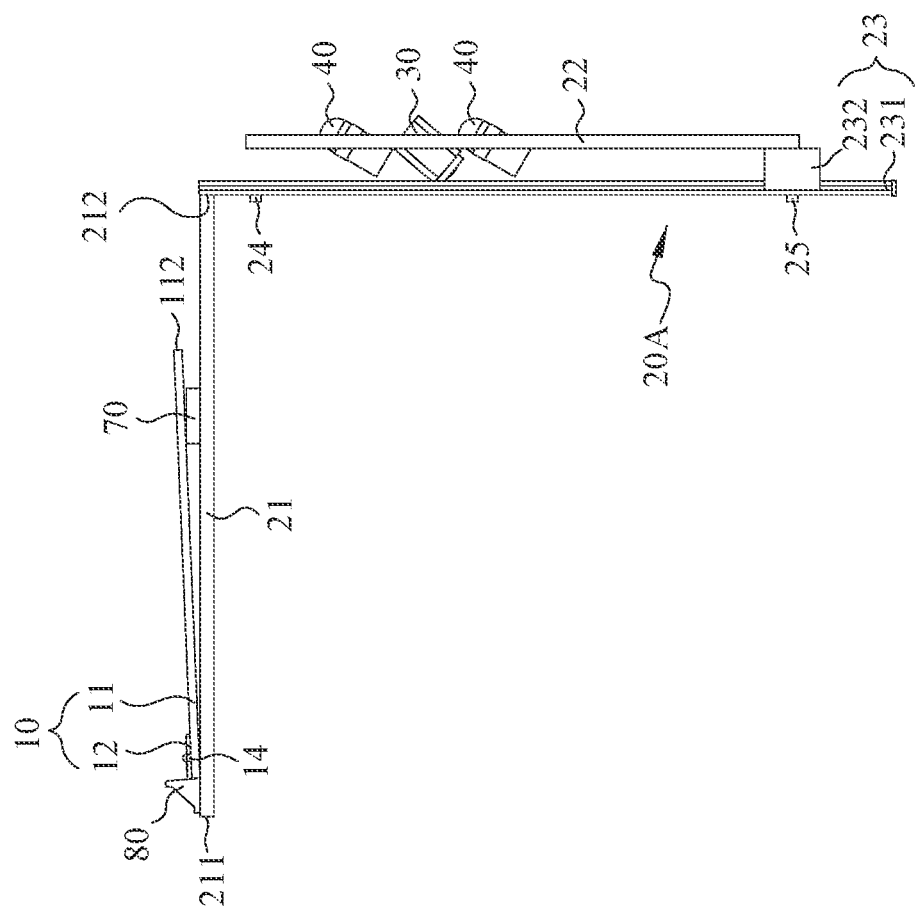
FIG. 10 is a side view of a fourth embodiment of the present invention.
Figure 11:
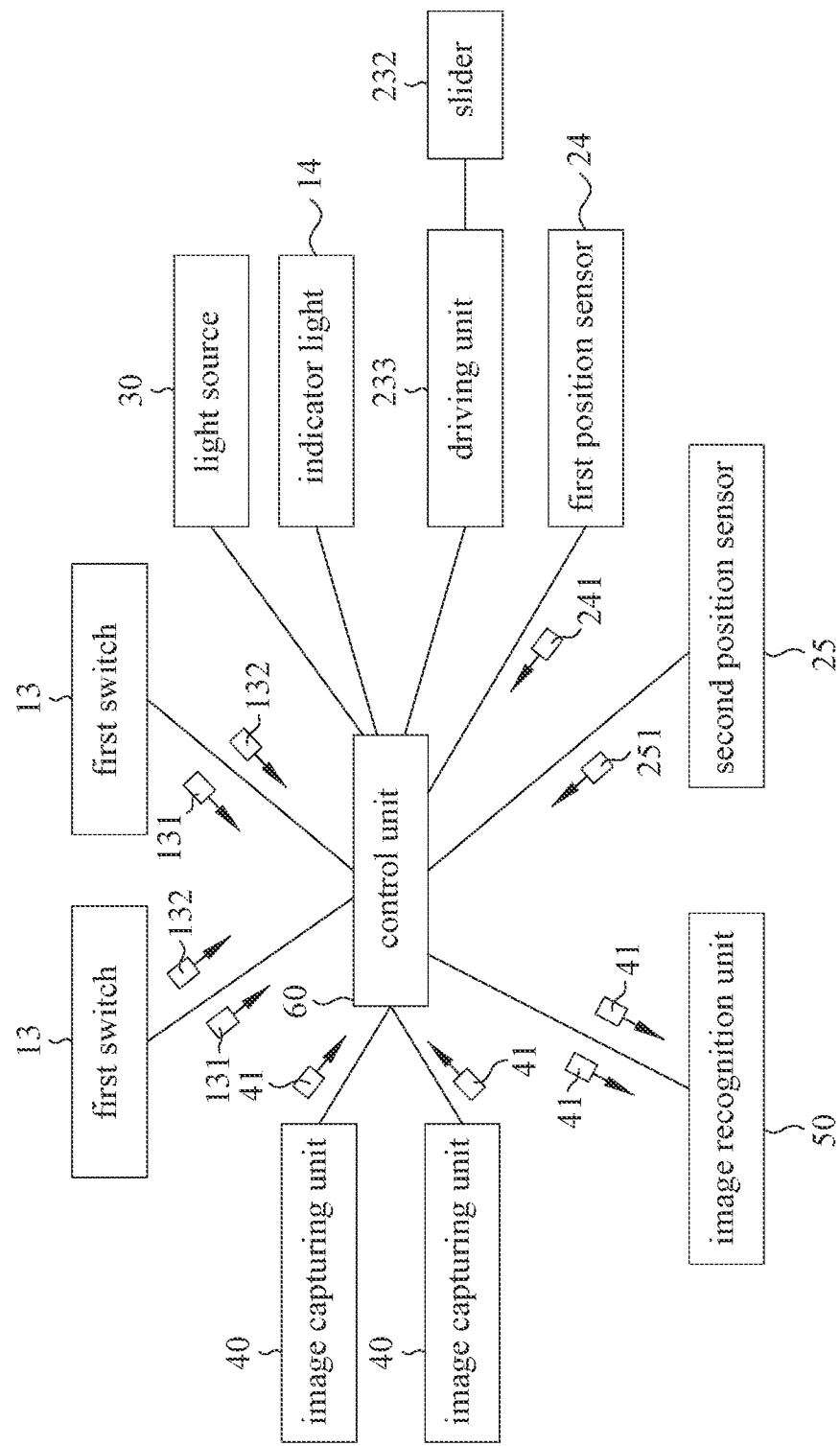
FIG. 11 is a block diagram showing the structure of the fourth embodiment of the present invention.

FIG. 10 and FIG. 11 are a side view and a structural block diagram of a fourth embodiment of the present invention, respectively. As shown in FIGS. 10 and 11, the difference between the fourth embodiment and the first embodiment is that the support frame 20A further includes a lifting mechanism 23, a first position sensor 24, and a second position sensor 25. The lifting mechanism 23 includes a rail 231, a slider 232, and a driving unit 233. The rail 231 is fixed on the second end 212 of the seat 21 and extends below the seat 21. The slider 232 slides on one side of the rail 231. The driving unit 233 is connected to the slider 232 and is electrically connected to the control unit 60. The support members 22 are disposed on the slider 232. The first position sensor 24 is disposed on the other side of the rail 231, close to the top of the rail 231, and is electrically connected to the control unit 60. The second position sensor 25 is disposed on the other side of the rail 231, close to the bottom end of the rail 231, and is electrically connected to the control unit 60.

Figure 12:
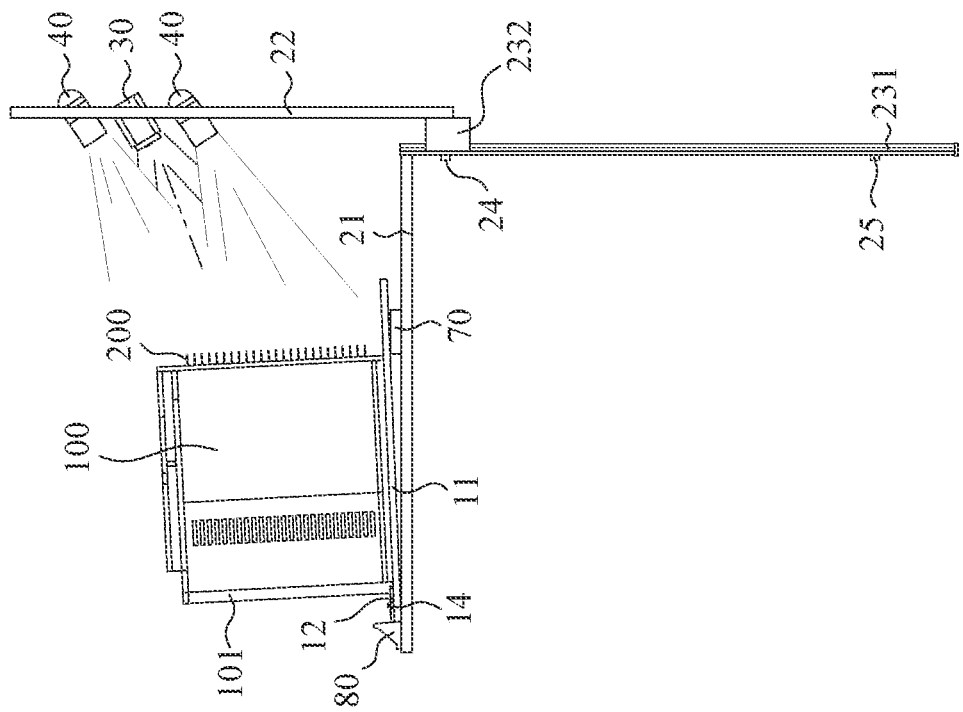
FIG. 12 is a schematic view of recognizing identification number performed by the fourth embodiment of the present invention.

FIG. 12 is a schematic view of the fourth embodiment of the present invention performing recognizing identification number. As shown in FIG. 11 and FIG. 12, when the wafer boat 100 is placed on the wafer boat placing portion 11, the control unit 60 controls the driving unit 233 according to the first activation signals 131, and the driving unit 233 drives the slider 232 to move upward along the rail 231, so that the slider 232 drives the support members 22 to move upward to the first position and is located above the seat 21. When the first position sensor 24 senses that the support members 22 are at the first position, the first position sensor 24 transmits a first sensing signal 241 to the control unit 60, and the control unit 60 determines that the support members 22 are located at the first position according to the first sensing signal 241 and further activates the light source 30, the image capturing units 40, and the image recognition unit 50 according to the first activation signal 131.

As shown in FIG. 10 and FIG. 11, after the wafer boat 100 is removed from the wafer boat placing portion 11, the control unit 60 controls the driving unit 233 according to the first turn-off signal 132, and the driving unit 233 drives the slider 232 to move downward along the rail 231, so that the slider 232 drives the support members 22 to move downward to the second position and is located below the seat 21. When the second position sensor 25 senses that the support members 22 are located at the second position, the second position sensor 25 transmits a second sensing signal 251 to the control unit 60, and the control unit 60 determines that the support members 22 are located at the second position according to the second sensing signal 251 and further turns off the light source 30, the image capturing units 40, and the image recognition unit 50 according to the first closing signal 132.

Compared with the first embodiment, the advantage of the fourth embodiment is that when the recognition operation is not performed, the support members 22 are located below the seat 21, and when the user is carrying the wafer boat 100, the wafer boat 100 will not collide with the support members 22, so as to prevent the wafers 200 from being damaged due to the impact force. Compared with the first embodiment, the disadvantage of the fourth embodiment is that when the recognition operation is started, the lifting mechanism 23 must drive the support members 22 to rise, and after the recognition operation is completed, the lifting mechanism 23 must drive the support members 22 to drop, the operation time is longer and the work is less efficient.

Figure 13:
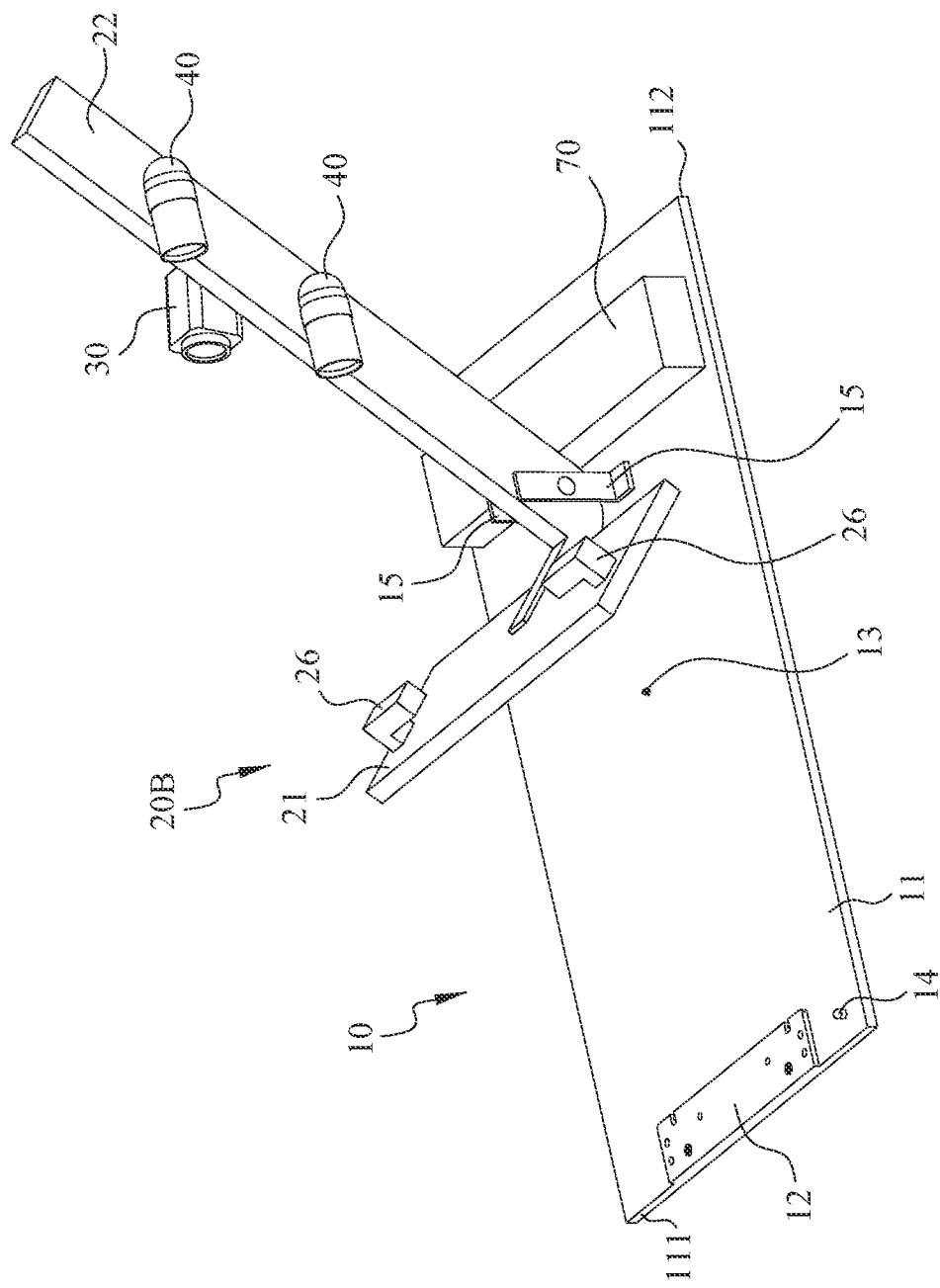
FIG. 13 is a schematic perspective view of a fifth embodiment of the present invention.
Figure 14:
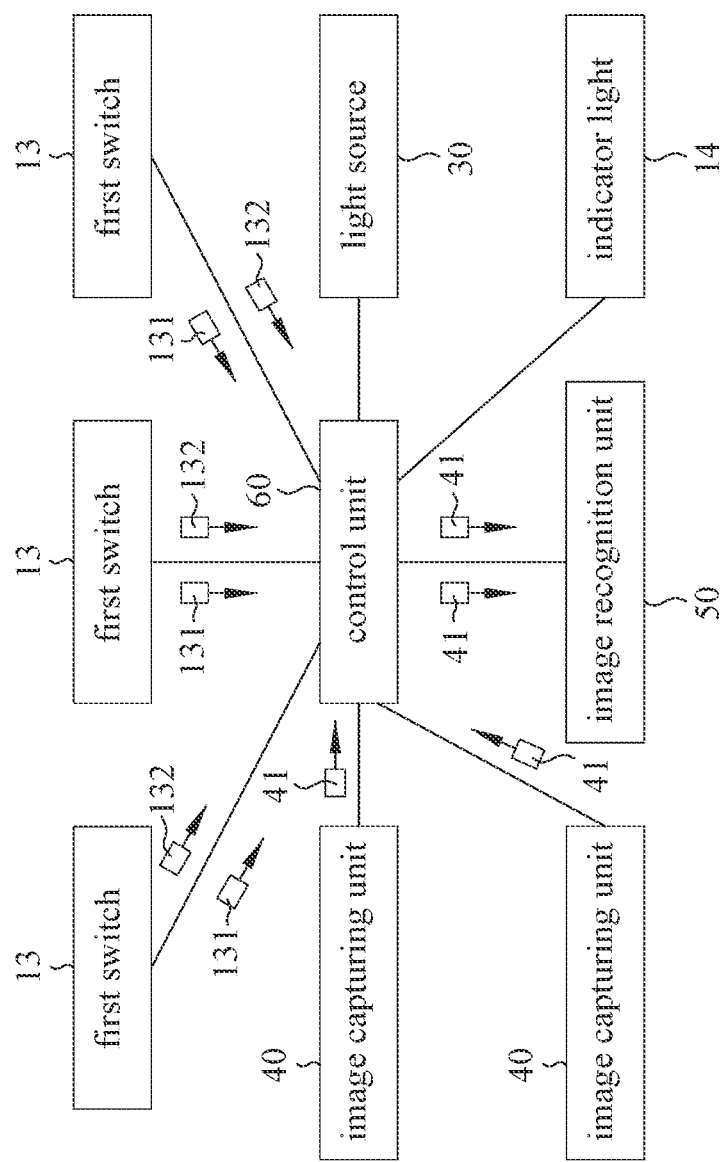
FIG. 14 is a block diagram showing the structure of the fifth embodiment of the present invention.

FIG. 13 and FIG. 14 are a schematic perspective view and a structural block diagram of a fifth embodiment of the present invention, respectively. As shown in FIG. 13 and FIG. 14, the differences between the fifth embodiment and the first embodiment are that: first, the base 10 further includes two pivot portions 15 and a first switch 13, and the pivot portions 15 are disposed on the wafer boat placing portion 11, the first switch 13 is arranged on the wafer boat placing portion 11 and is located below the seat 21; secondly, the spacer 70 is arranged on the wafer boat placing portion 11 and is located between the pivot portions 15 and the second end 112 of the wafer boat placing portion 11; thirdly, the support frame 20B only includes a support member 22, the support member 22 is pivoted between the pivot portions 15 and abuts against the spacer 70, and the spacer 70 can keep the support member 22 maintained in an inclined state relative to the wafer boat placing portion 11, so that the seat 21 can be tilted upward relative to the wafer boat placing portion 11; fourthly, the light source 30 and the image capture units 40 are respectively disposed on the second side of the support member 22; and fifthly, the support frame 20B further includes two abutting portions 26, and these abutting portions 26 are disposed on the seat 21.

Figure 15:
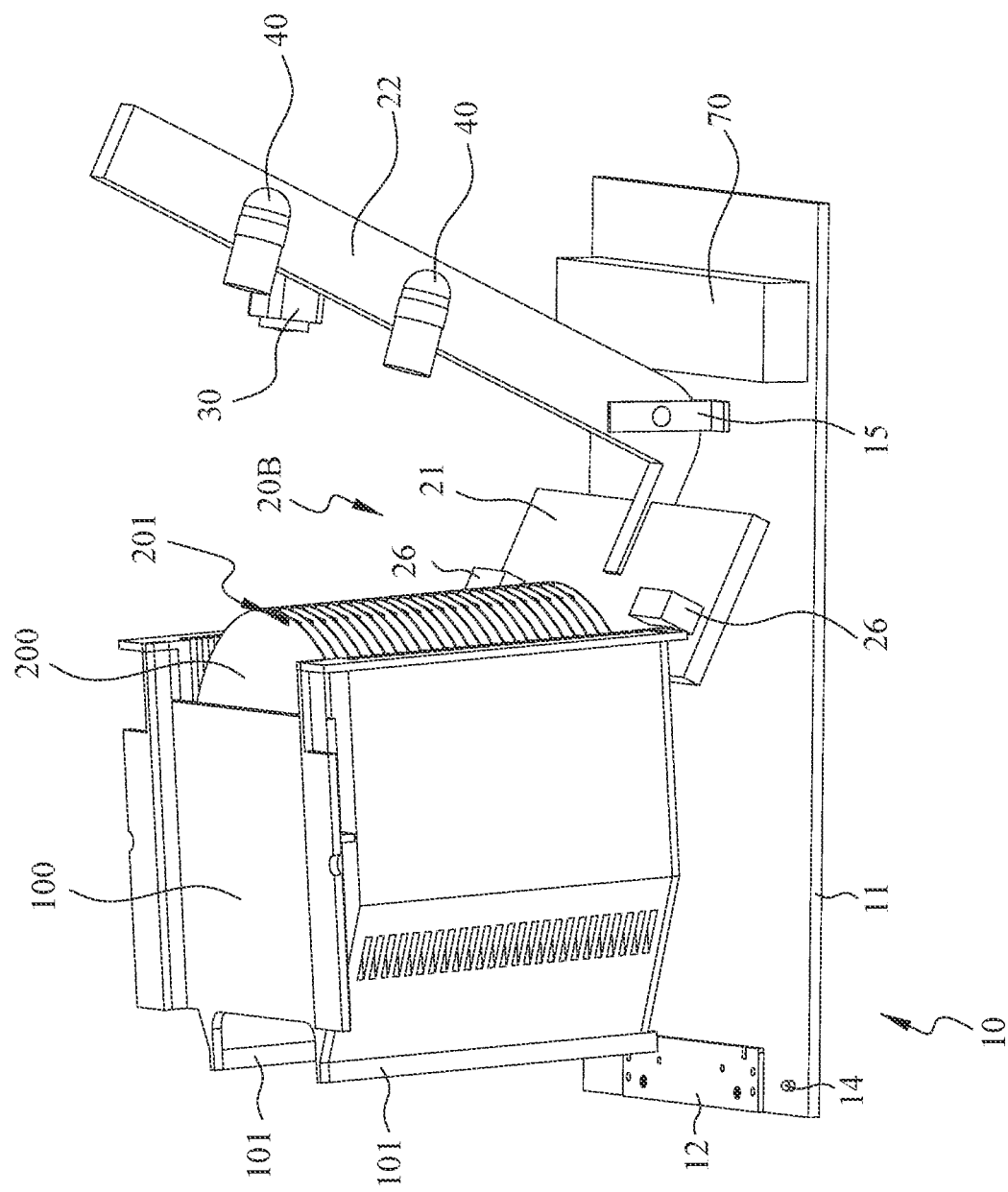
FIG. 15 shows a schematic view of the wafer boat contacting the seat.
Figure 16A:
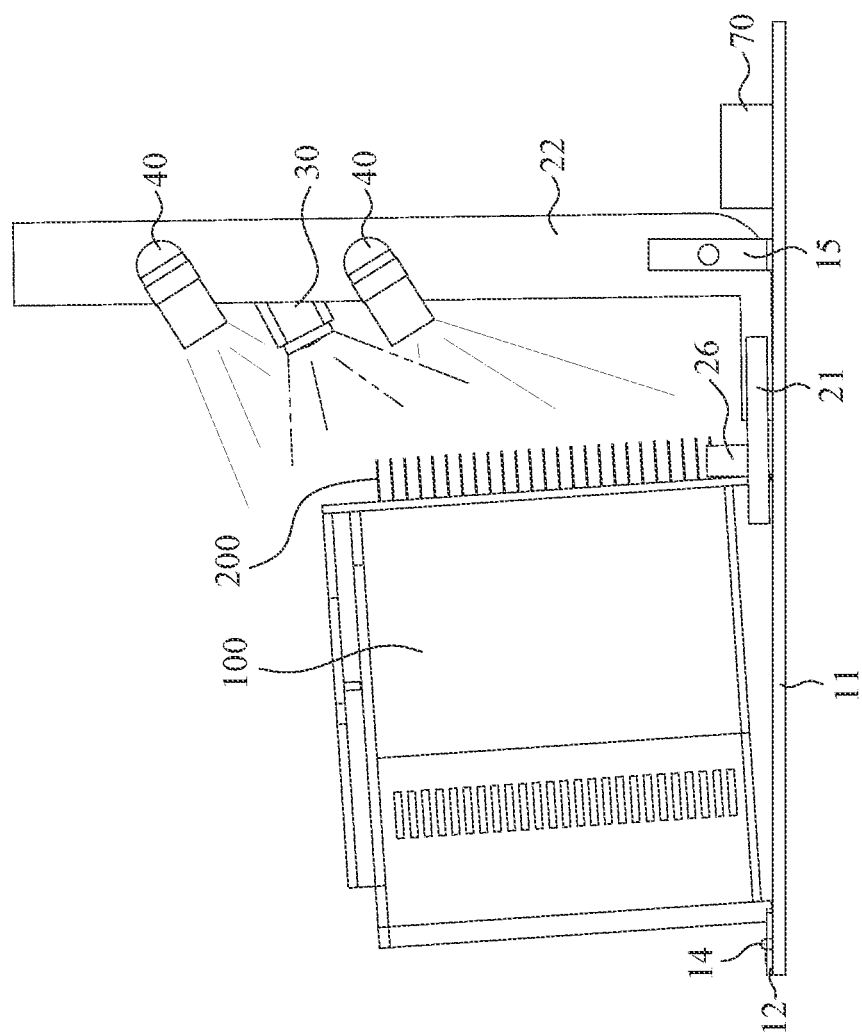
FIG. 16A is a schematic view of recognizing identification number performed by the fifth embodiment of the present invention.
Figure 16B:
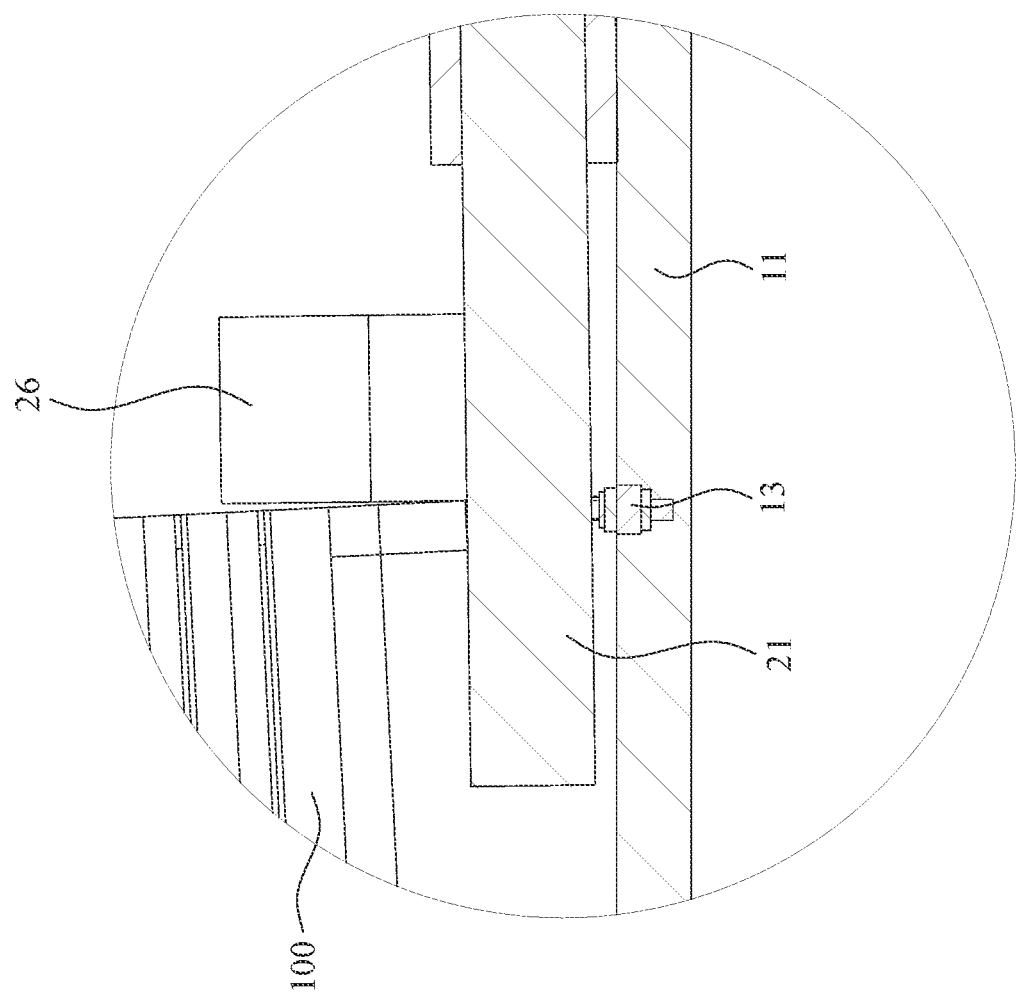
FIG. 16B shows a schematic view of the base pressing the first switch.

FIG. 15 shows a schematic view of the wafer boat 100 contacting the seat 21, FIG. 16A is a schematic view of the fifth embodiment of the present invention performing recognizing identification number, and FIG. 16B shows a schematic view of the seat 21 pressing the first switch 13. As shown in FIG. 15, when the wafer boat 100 contacts the seat 21, the wafer boat 100 abuts against the abutting portions 26, and the abutting portions 26 can prevent the wafer boat 100 from sliding toward the support member 22. As shown in FIG. 16A, the seat 21 is pressed down by the weight of the wafer boat 100 and rotates downward to the first position, the support member 22 is pulled by the seat 21 and rotates upward relative to the pivot portion 15, and the wafer boat 100 is placed on the wafer boat placement part 11. The two protrusions 101 of the wafer boat 100 are respectively located in the positioning grooves 121 and press the first switches 13 (see FIG. 4B), while the seat 21 presses the first switches 13 (see FIG. 16B). As shown in FIG. 14, the first switches 13 transmit a first activation signal 131 to the control unit 60 synchronously, and the control unit 60 activates the light source 30, the image capturing units 40, and the image recognition unit 50 according to the first activation signals 131. As shown in FIG. 16A, the light source 30 laterally projects light to the wafers 200 in the wafer boat 100 for supplementary light, and the image capturing units 40 laterally capture the images 41 of identification numbers of the wafers 200 in the wafer boat 100. As shown in FIG. 14, the control unit 60 receives the images 41 of the identification numbers of the wafers 200 and transmits them to the image recognition unit 50, and the image recognition unit 50 recognizes the identification numbers of the wafers 200 according to the images 41 of the identification numbers of the wafers 200.

As shown in FIG. 13 and FIG. 14, after the wafer boat 100 is removed from the wafer boat placing portion 11, the weight of the support member 22 can cause the support member 22 to rotate downward relative to the pivot portions 15, and the seat 21 is subjected to the pull of the support member 22 to rotate upward to the second position, and the support member 22 abuts against the spacer 70. At this time, the first switches 13 synchronously transmit a first turn-off signal 132 to the control unit 60, and the control unit 60 turns off the light source 30, the image capturing units 40, and the image recognition unit 50 according to the first turn-off signals 132.

Figure 17:
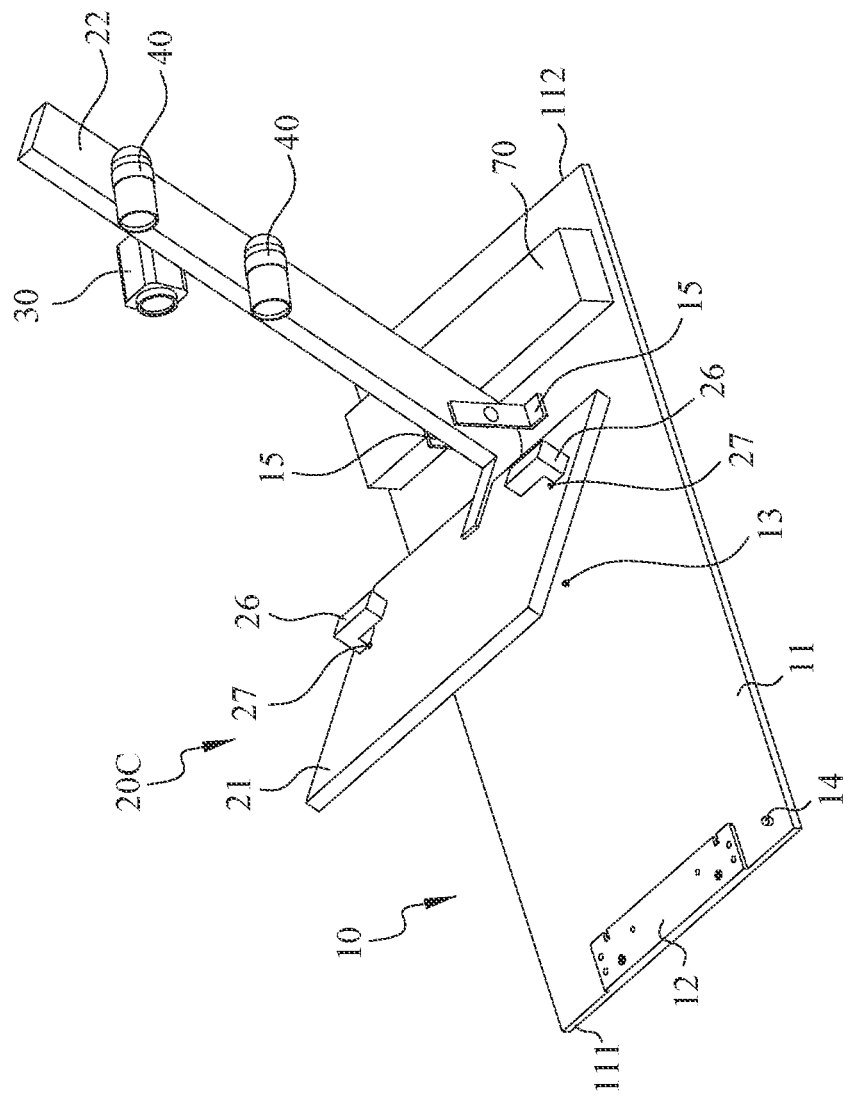
FIG. 17 is a schematic perspective view of a sixth embodiment of the present invention.
Figure 18:
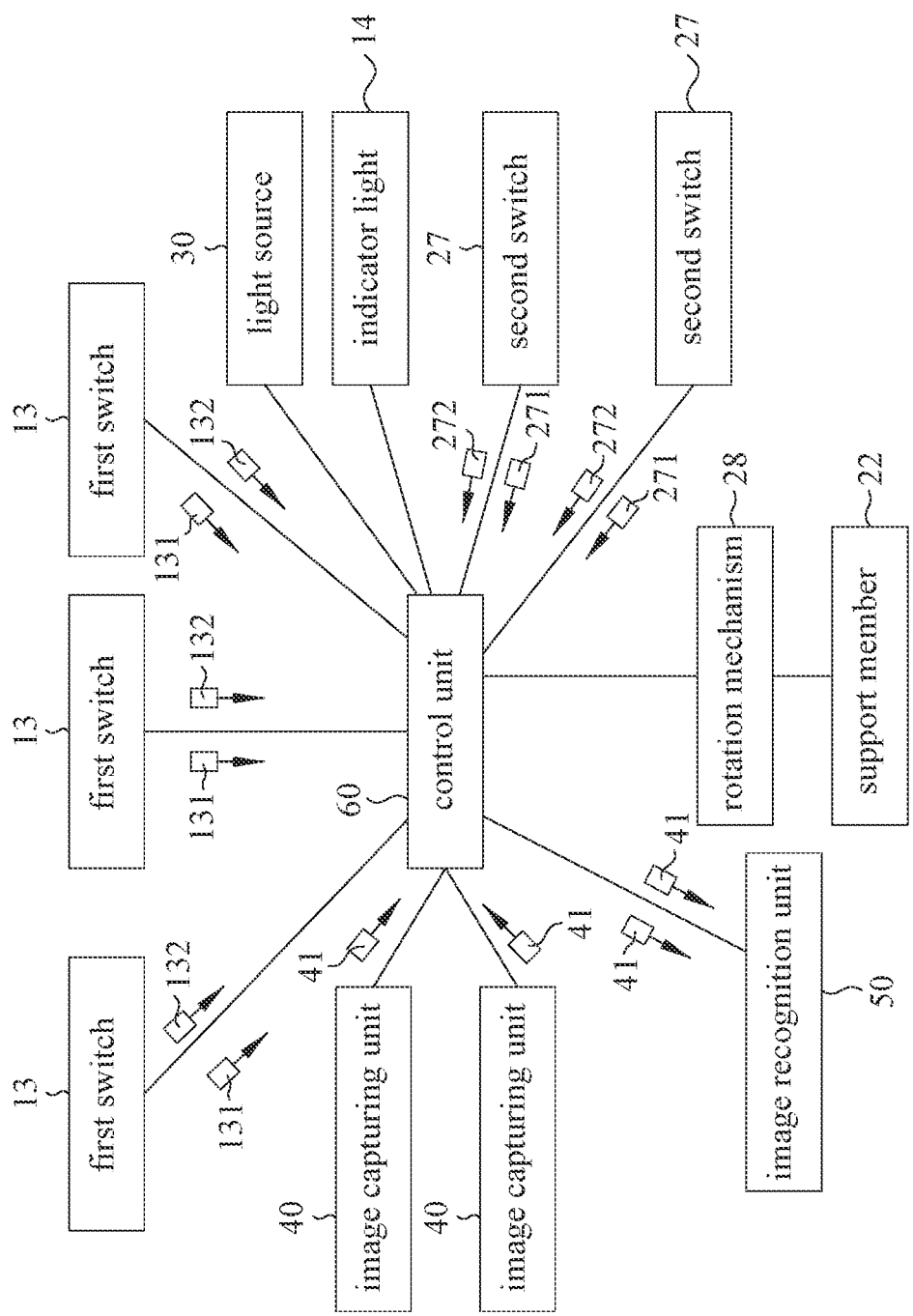
FIG. 18 is a block diagram showing the structure of the sixth embodiment of the present invention.

FIG. 17 and FIG. 18 are a schematic perspective view and a structural block diagram of a sixth embodiment of the present invention, respectively. As shown in FIG. 17 and FIG. 18, the difference between the sixth embodiment and the fifth embodiment is that the support frame 20C further includes two second switches 27 and a rotation mechanism 28, and the second switches 27 are disposed on the seat 21 and electrically connected to the control unit 60, the rotation mechanism 28 is connected to the support member 22 and is electrically connected to the control unit 60.

Figure 19:
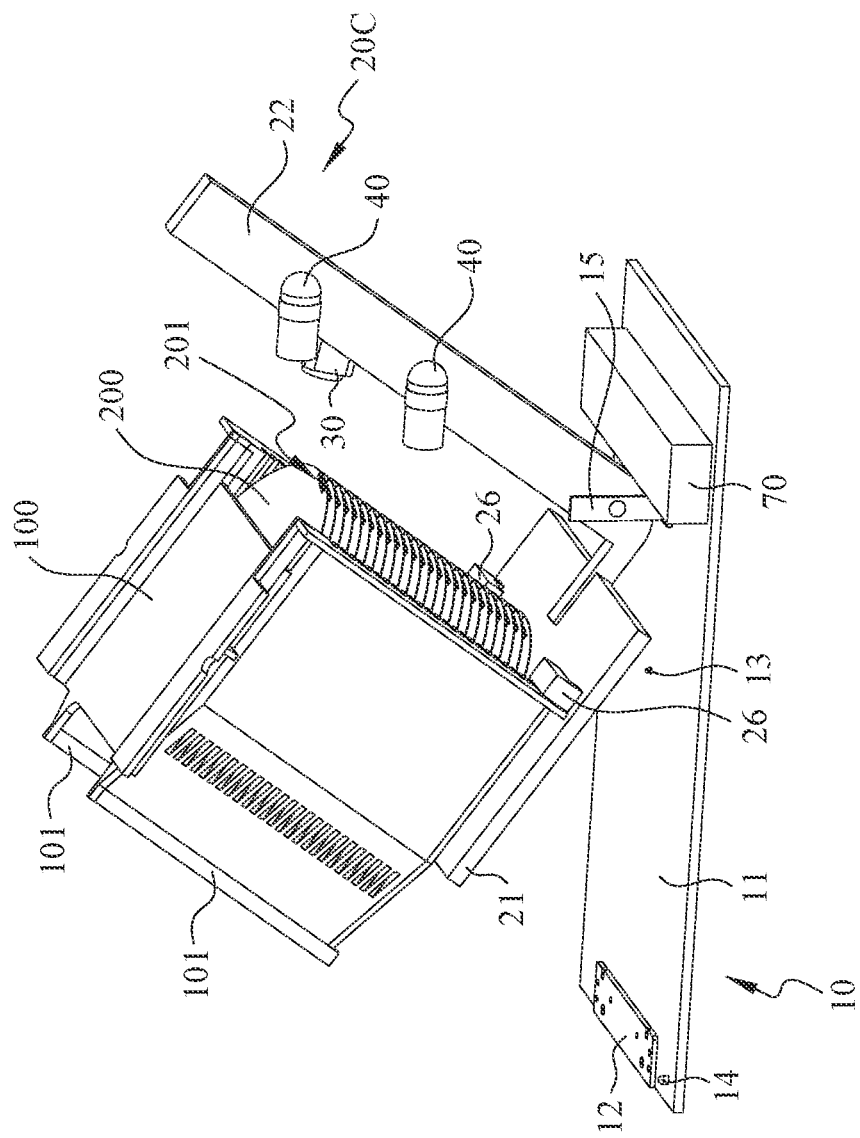
FIG. 19 shows a schematic view of the wafer boat contacting the seat.
Figure 20:
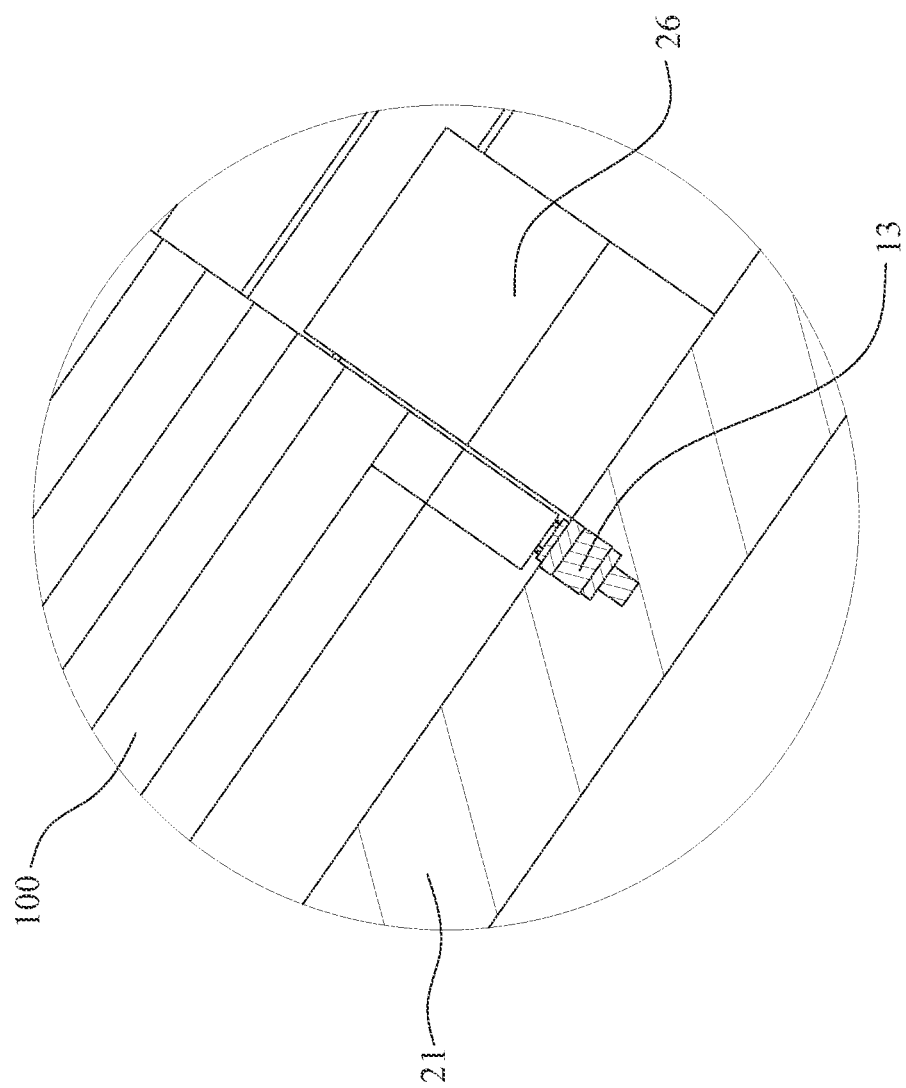
FIG. 20 shows a schematic view of the wafer boat pressing the second switch.
Figure 21:
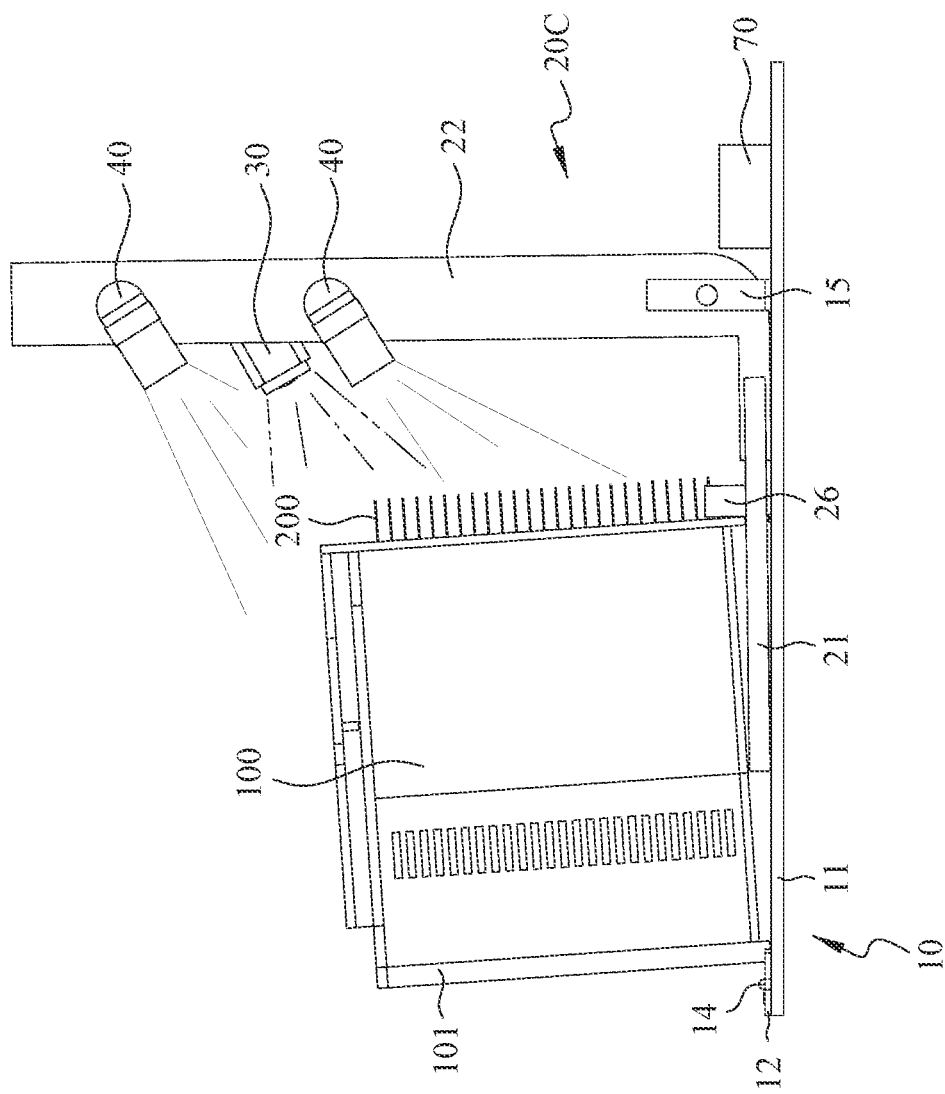
FIG. 21 is a schematic view of recognizing identification number performed by the sixth embodiment of the present invention.

FIG. 19 shows a schematic view of the wafer boat 100 contacting the seat 21, FIG. 20 shows a schematic view of the wafer boat 100 pressing the second switches 27, and FIG. 21 is a schematic view showing the sixth embodiment of the present invention performing recognizing dentification number. As shown in FIGS. 19 and 20, when the wafer boat 100 contacts the seat 21, the wafer boat 100 presses the second switches 27 and abuts against the abutting portions 26. As shown in FIG. 18 and FIG. 21, the second switches 27 simultaneously transmit a second activation signal 271 to the control unit 60, and the control unit 60 controls the rotation mechanism 28 according to the second activation signals 271, and the rotation mechanism 28 drives the support member 22 to rotate upward relative to the pivot portions 15, the seat 21 is pulled by the support member 22 and rotates downward to the first position, and the wafer boat 100 is placed on the wafer boat placing portion 11.

As shown in FIG. 17 and FIG. 18, after the wafer boat 100 is removed from the wafer boat placing portion 11, the second switches 27 simultaneously transmit a second turn-off signal 272, and the control unit 60 controls the rotation mechanism 28 according to the second turn-off signal 272. The rotation mechanism 28 drives the support member 22 to rotate downward relative to the pivot portions 15, and the seat 21 is pulled by the support member 22 to rotate upward to the second position.

In summary, the device for recognizing wafer identification number of the present invention can automatically turn on and off the light source, the image capturing unit, and the image recognition unit, and the operation is simple.

Furthermore, the device for recognizing wafer identification number of the present invention can use a light source to supplement light and a plurality of image capturing units to capture images from different angles, which is not easily disturbed by the external environment and improves the recognition effect.

Moreover, the device for recognizing wafer identification number of the present invention does not need to know or obtain fonts in advance, and is easy to cope with various production lines with mixed batches.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A device for recognizing wafer identification number with automatically turning on and off recognizing function, comprising:
    a base, comprising a wafer boat placing portion and at least one first switch disposed on the wafer boat placing portion;
    a support frame;
    at least one light source, disposed on the support frame;
    a plurality of image capturing units, disposed on the support frame;
    an image recognition unit, disposed on the support frame; and
    a control unit, electrically connected to the at least one first switch, the at least one light source, the image capturing units, and the image recognition unit;
    wherein, when a wafer boat is placed on the wafer boat placing portion, the at least one first switch transmits a first activation signal to the control unit, and the control unit activates the at least one light source, the image capturing units and the image recognition unit according to the first activation signal unit, the at least one light source projects light to a plurality of wafers in the wafer boat for supplementary light, the image capturing units capture images of the identification numbers of the wafers in the wafer boat, the control unit receives the images of the identification numbers of the wafers and sends to the image recognition unit, and the image recognition unit recognizes the identification numbers of the wafers according to the images of the identification numbers of the wafers; and
    wherein, after the wafer boat is removed from the wafer boat placing portion, the at least one first switch transmits a first turn-off signal to the control unit, and the control unit turns off the at least one light source, the image capturing units and the image recognition unit according to the first turn-off signal.

2. The device for recognizing wafer identification number according to claim 1, wherein the base further comprises a positioning member, the positioning member is disposed on the wafer boat placing portion and defines at least one positioning groove, and the at least one first switch is located in the at least one positioning groove; and wherein when the wafer boat is placed in the wafer boat placing portion, at least one protrusion of the wafer boat is positioned in the at least one positioning groove and presses the at least one first switch.

3. The device for recognizing wafer identification number according to claim 1, wherein the support frame comprises a seat and a support member, the wafer boat placing portion is disposed on the seat, the support member is fixed on the seat, and the at least one light source and the image capturing units are disposed on the support member.

4. The device for recognizing wafer identification number according to claim 1, wherein the support frame comprises a seat and a support member, the wafer boat placing portion is disposed on the seat, the support member can be lifted and lowered relative to the seat, and the at least one light source and the image capturing units are disposed on the support member; wherein when the wafer boat is placed in the wafer boat placing portion, the support member moves upward to a first position and is located above the seat; and wherein, after the wafer boat is removed from the wafer boat placing portion, the support member moves downward to a second position and below the seat.

5. The device for recognizing wafer identification number according to claim 4, wherein the support frame further comprises a lifting mechanism, the lifting mechanism is disposed on the seat and is electrically connected to the control unit, and the support member is disposed on the lifting mechanism; wherein, when the wafer boat is placed on the wafer boat placing portion, the control unit controls the lifting mechanism according to the first activation signal, so that the lifting mechanism drives the support member to move upward to the first position; and wherein, after the wafer boat is removed from the wafer boat placing portion, the control unit controls the lifting mechanism according to the first turn-off signal, so that the lifting mechanism drives the support member to move downward to the second position.

6. The device for recognizing wafer identification number according to claim 5, wherein the lifting mechanism comprises a rail, a slider and a driving unit, the rail is fixed to the seat, the slider is slidably disposed on the rail, the driving unit is connected to the slider and is electrically connected to the control unit, and the support member is disposed on the slider; wherein, when the wafer boat is placed on the wafer boat placing portion, the control unit controls the driving unit according to the first activation signal, and the driving unit drives the slider to move upward along the rail, so that the slider drives the support member to move upward to the first position; wherein, after the wafer boat is removed from the wafer boat placing portion, the control unit controls the driving unit according to the first turn-off signal, and the driving unit drives the slider to move downward along the rail, so that the slider drives the support member downward to the second position.

7. The device for recognizing wafer identification number according to claim 5, wherein the support frame further comprises a first position sensor and a second position sensor, the first position sensor is disposed on the lifting mechanism and is electrically connected to the control unit, and the second position sensor is disposed on the lifting mechanism and is electrically connected to the control unit; wherein, when the first position sensor senses that the support member is at the first position, the first position sensor transmits a first sensing signal to the control unit, the control unit determines that the support member is located at the first position according to the first sensing signal and further activates the at least one light source, the image capturing units and the image recognition unit according to the first activation signal; and wherein, when the second position sensor senses that the support member is at the second position, the second position sensor sends a second sensing signal to the control unit, and the control unit determines that the support member is at the second position according to the second sensing signal and further turns off the at least one light source, the image capturing units and the image recognition units according to the first turn-off signal.

8. The device for recognizing wafer identification number according to claim 1, wherein the base comprises a pivot portion, the pivot portion is disposed on the wafer boat placing portion, the support frame comprises a seat and a support member, and the support member is fixed on the seat and pivoted on the pivot portion, the at least one light source and the image capturing units are all disposed on the support member; wherein, when the wafer boat contacts the seat, the support member rotates upward relative to the pivot portion, so that the seat rotates downward to a first position, and the wafer boat is placed in the wafer boat placing portion; and wherein, after the wafer boat is removed from the wafer boat placing portion, the support member is rotated downward relative to the pivot portion, so that the seat is rotated upward to a second position.

9. The device for recognizing wafer identification number according to claim 8, wherein when the wafer boat contacts the seat, the base is pressed down by the weight of the wafer boat and rotates downward, while the support member is pulled by the seat and rotates upward relative to the pivot portion; and wherein, after the wafer boat is removed from the wafer boat placing portion, the weight of the support member makes the support member rotate downward relative to the pivot portion, and the seat is pulled by the support member to rotate upward to the second position.

10. The device for recognizing wafer identification number according to claim 8, wherein the support frame further comprises at least one second switch and a rotation mechanism, the at least one second switch is disposed on the base and is electrically connected to the control unit, and the rotation mechanism is connected to the support member and electrically connected to the control unit; wherein when the wafer boat contacts the seat, the at least one second switch transmits a second activation signal to the control unit, the control unit controls the rotation mechanism according to the second activation signal, the rotation mechanism drives the support member to rotate upward relative to the pivot portion, and the seat is pulled by the support member to rotate downward to the first position, and the wafer boat is placed in the wafer boat placing portion; and wherein, after the wafer boat is removed from the wafer boat placing portion, the at least one second switch transmits a second turn-off signal, the control unit controls the rotation mechanism according to the second turn-off signal, the rotation mechanism drives the support member to rotate downward relative to the pivot portion, and the seat is pulled by the support member to rotate upward to the second position.

* * * * *